United States Patent
Lin et al.

(10) Patent No.: US 11,380,371 B2
(45) Date of Patent: Jul. 5, 2022

(54) SENSE AMPLIFIER AND OPERATING METHOD FOR NON-VOLATILE MEMORY WITH REDUCED NEED ON ADJUSTING OFFSET TO COMPENSATE THE MISMATCH

(71) Applicant: Taiwan Semiconductor Manufacturing Company, Ltd., Hsinchu (TW)

(72) Inventors: Ku-Feng Lin, New Taipei (TW); Yu-Der Chih, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/096,966

(22) Filed: Nov. 13, 2020

(65) Prior Publication Data
US 2022/0157351 A1 May 19, 2022

(51) Int. Cl.
*G11C 7/02* (2006.01)
*G11C 7/06* (2006.01)
*G11C 7/08* (2006.01)
*G11C 7/12* (2006.01)

(52) U.S. Cl.
CPC .............. *G11C 7/062* (2013.01); *G11C 7/08* (2013.01); *G11C 7/12* (2013.01)

(58) Field of Classification Search
CPC .............. G11C 7/062; G11C 7/08; G11C 7/12
USPC ....................................................... 365/207
See application file for complete search history.

(56) References Cited

U.S. PATENT DOCUMENTS

| 5,729,492 | A | 3/1998 | Campardo |
| 8,947,935 | B2* | 2/2015 | Kim ................ G11C 16/28 |
| | | | 365/185.24 |
| 9,875,774 | B1* | 1/2018 | Yu .................... G11C 7/10 |
| 10,566,045 | B2* | 2/2020 | Lee .................. G11C 11/165 |
| 10,658,022 | B1 | 5/2020 | Maffitt |
| 10,726,897 | B1 | 7/2020 | Maffitt et al. |
| 2016/0078915 | A1* | 3/2016 | Katayama ........... G11C 7/065 |
| | | | 365/158 |
| 2019/0362760 | A1 | 11/2019 | Lin et al. |

FOREIGN PATENT DOCUMENTS

| TW | 201939489 | 10/2019 |
| WO | 2015013023 | 1/2015 |

OTHER PUBLICATIONS

"Office Action of German Counterpart Application," dated Jun. 11, 2021, p. 1-p. 8.
Office Action of Taiwan Counterpart Application, with English translation thereof, dated Jul. 29, 2021, pp. 1-9.

* cited by examiner

*Primary Examiner* — Tha-O H Bui
(74) *Attorney, Agent, or Firm* — JCIPRNET

(57) ABSTRACT

A sense amplifier includes a voltage comparator with offset compensation, a first clamping device and a second clamping device. The voltage comparator is coupled to a bit line and a reference bit line respectively, and configured to compare a first input voltage and a second input voltage to output a sensing signal. The first clamping circuit and the second clamping circuit trim a voltage corresponding to the bit line and a voltage corresponding to the reference bit line respectively to match the voltage corresponding to the reference bit line with the voltage corresponding to the bit line.

20 Claims, 14 Drawing Sheets

SENSE AMPLIFIER AND OPERATING METHOD FOR NON-VOLATILE MEMORY WITH REDUCED NEED ON ADJUSTING OFFSET TO COMPENSATE THE MISMATCH

BACKGROUND

The improvement in integration density of electronic components (e.g., transistors, diodes, resistors, capacitors, etc.) in integrated circuits (IC) has come from shrinking the semiconductor process node, which entails reductions in operating voltage and current consumption of electronic circuits developed in the semiconductor process node. Accordingly, access speed of memory integrated circuits is expected to become faster. For example, some memories have a very small read window, which requires a low-offset sense amplifier for a successful read operation.

A mismatch or offset between components often exists in a sense amplifier circuit due to unavoidable process variations. According to an existing method, a sense amplifier undergoes an offset sampling or cancelling stage before an actual read operation to cancel out the mismatch of the sense amplifier circuit. In addition, the offset-compensation sense amplifiers cannot cancel the variations of reference cells, which are usually used in a read path design and suffer process variations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
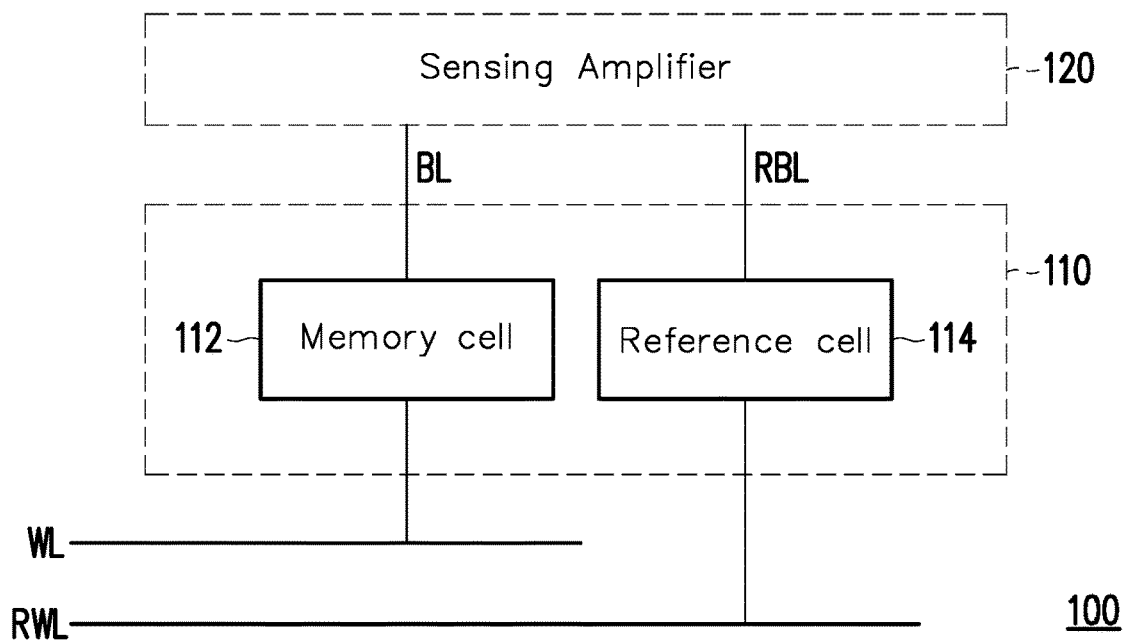
FIG. 1 illustrates a schematic diagram of non-volatile memory having a sense amplifier, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Referring to FIG. 1, a non-volatile memory 100 includes a memory array 110 and a sense amplifier 120. The memory array 110 includes a plurality of memory cells located in an intersection area between word lines and bit lines. The memory array 110 may further include at least one reference memory cell. The memory cells of the memory array 110 include a memory cell 112 coupled to a bit line BL and a word line WL, and the reference memory cell 114 coupled to a reference word line RWL and a reference bit line RBL. The sense amplifier 120 is coupled to the memory cell 112 and the reference memory cell 114 via the bit line BL and the reference bit line RBL, respectively.

The sense amplifier 120 is configured to perform a read operation or a sensing operation to sense the value of data stored in the memory cell 112. For example, the sense amplifier 120 may compare the data stored in the memory cell 112 with a reference value (e.g., the reference data of the reference memory cell 114) to output a sensing signal which indicate the value of data stored in the memory cell 112.

Figure 2:
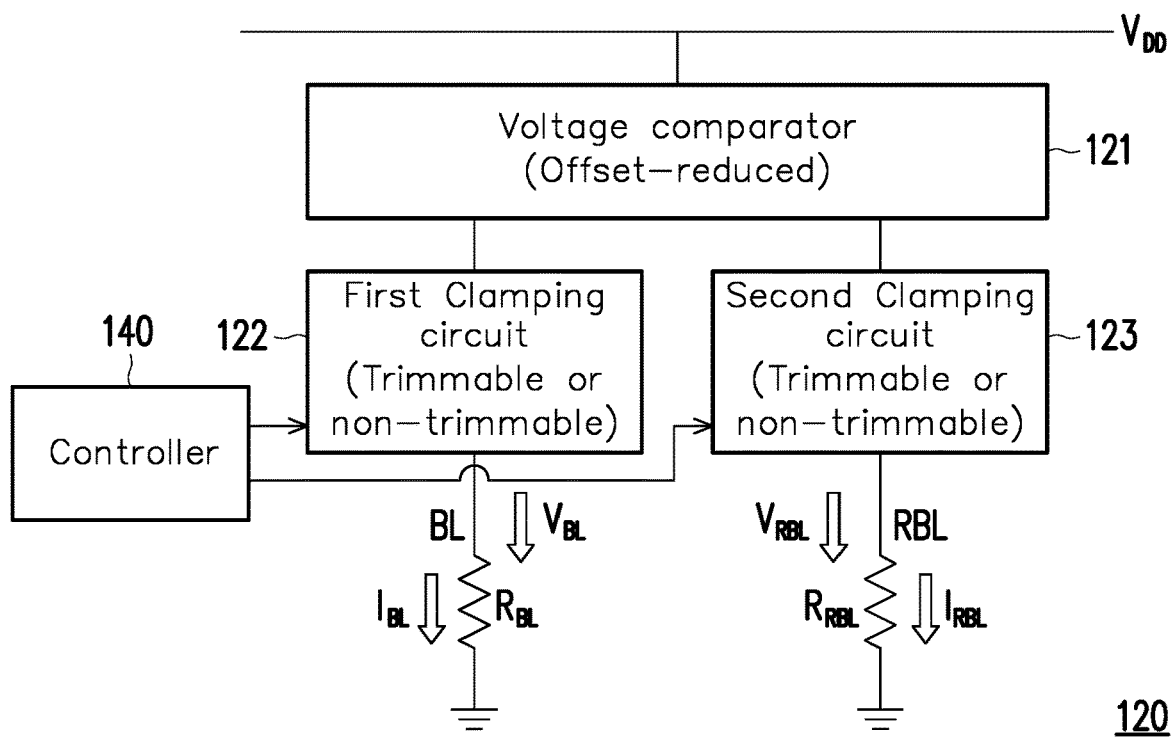
FIG. 2 illustrates a schematic block diagram of a sense amplifier, in accordance with some embodiments of the present disclosure.

Referring to FIG. 2, the sense amplifier 120 includes a voltage comparator 121 (offset-compensation voltage comparator), a first clamping circuit 122 and a second clamping circuit 123. In theory, because circuit structures of the first clamping circuit 122 and the second clamping circuit 123 are the same, these two clamping circuits 122 and 123 have the same threshold voltages Vth. And, in theory, if the resistor $R_{BL}$ on the bit line BL and the resistor $R_{RBL}$ on the reference bit line RBL are the same and the currents $I_{BL}$ and $I_{RBL}$ are the same (i.e., the voltage $V_{BL}$ of the bit line BL and the voltage $V_{RBL}$ of the reference bit line RBL are matched), the voltage comparator 121 may detect that the voltage provided by the first clamping circuit 122 is the same as the voltage provided by the second clamping circuit 123. But, depending on semiconductor manufacturing process for manufacturing transistors, physical characteristics of each transistor may have slightly different, thus it may appear the mismatch between the threshold voltage Vth of transistors (i.e., metal-oxide-semiconductor field-effect transistor, MOSs) in the first clamping circuit 122 and the threshold voltage Vth of MOSs in the first clamping circuit 123.

For compensating the mismatch of the threshold voltage Vth of the MOSs in the first clamping circuit 122 and the threshold voltage Vth of the MOSs in the second clamping circuit 123, at least one of the first clamping circuit 122 and the second clamping circuit 123 have trimming correction function (e.g., trimmable) for matching the threshold voltage Vth of MOSs in the first clamping circuit 122 and the threshold voltage Vth of MOSs. Thus, the voltage $V_{BL}$ of the bit line BL and the voltage $V_{RBL}$ of the reference bit line RBL provided by trimming circuits 122 and 123 are matched by the at least one of the first clamping circuit 122 and the second clamping circuit 123 with trimming correction functions in the embodiment of the present disclosure. The trimming correction function(s) of at least one of the first clamping circuit 122 and the second clamping circuit 123 may be controlled by the controller 140. The at least one of the first clamping circuit 122 and the second clamping circuit 123 with trimming correction function(s) means the first clamping circuit 122, the second clamping circuit 123, or both the first clamping circuit 122 and the second clamping circuit 123 have the trimming correction function.

For example, the voltage (e.g., $V_{BL}$) corresponding to the bit line BL and the voltage (e.g., $V_{RBL}$) corresponding to the reference bit line RBL may be trimmed to be the same voltage level by the first clamping circuit or/and the second clamping circuit while the memory cell is in the reset situation (i.e., the current $I_{BL}$ is low). In detail, the first clamping circuit 122 and the second clamping circuit 123 with trimming correction function(s) (e.g., the trimmable clamping circuit 122 and/or 123) has a main branch circuit and a plurality of trimming branch circuits. Each trimming branch circuit has a current path and a switch, the switch is for conducting the current path or not and is controlled by the controller 140. The controller 140 controls a number of the switches in the trimming branch circuits, and sense the voltage $V_{BL}$ corresponding to the bit line BL and the $V_{RBL}$ corresponding to the reference bit line RBL are the same or not, so as to trim the voltage $V_{BL}$ and the $V_{RBL}$ to be the same voltage level. Changes between the bit-line current $I_{BL}$ corresponding to $V_{BL}$ and the reference bit-line current $I_{RBL}$ corresponding to $V_{RBL}$ may be registered by the voltage comparator 120 which may output the difference between the bit-line current $I_{BL}$ and the reference bit-line current $I_{RBL}$. It is understood that the comparator 120 may also be used to measure voltage differences for the bit line BL and the reference bit line RBL rather than current differences. The sense amplifier 120 further includes a controller 140. The controller 140 may couple to the voltage comparator 121, the first clamping circuit 122 and the second clamping circuit 123 for controlling switches into the voltage comparator 121, the first clamping circuit 122 and the second clamping circuit 123, so as to implement the functions of the voltage comparator 121, the first clamping circuit 122 and the second clamping circuit 123.

Figure 3A:
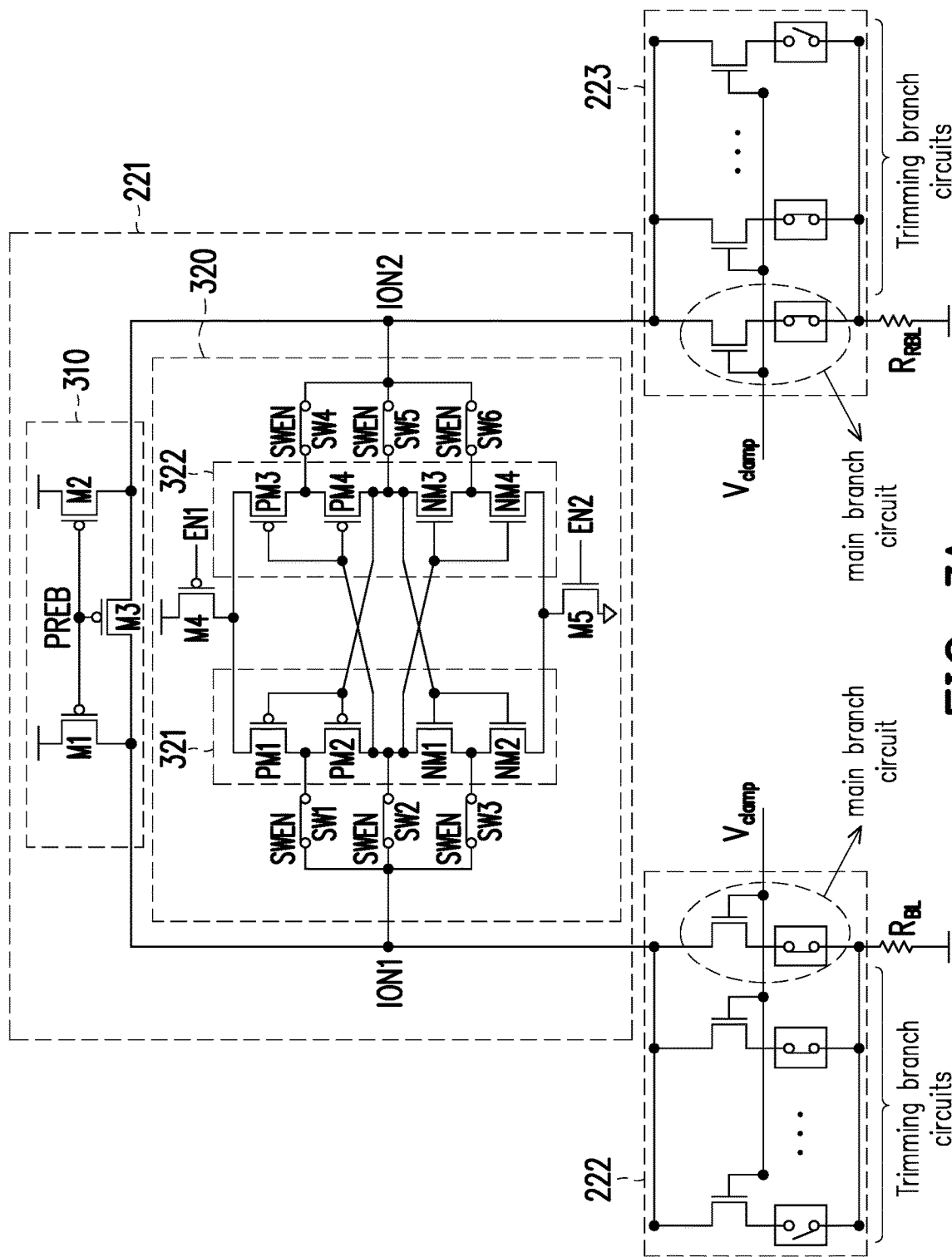
FIG. 3A illustrates a schematic diagram of a sense amplifier, in accordance with some embodiments of the present disclosure.

Referring to FIGS. 2 and 3A, a sense amplifier 220 includes a voltage comparator 221, a first clamping circuit 222 and a second clamping circuit 223. The voltage comparator 221 is one example of the voltage comparator 121 in FIG. 2 of the embodiment of the disclosure, the first clamping circuit 222 is one example of the first clamping circuit 122 in FIG. 2 of the embodiment of the disclosure, and the second clamping circuit 223 is one example of the second clamping circuit 123 in FIG. 2 of the embodiment of the disclosure. The voltage comparator 221 is coupled to a bit line BL and a reference bit line RBL via a first I/O node ION1 and a second I/O node ION2 of the sense amplifier 220. The sense amplifier is configured to compare a first input voltage and a second input voltage (inputted via the first I/O node ION1 and the second I/O node ION2) to output a sensing signal (outputted from the first I/O node ION1 and the second I/O node ION2).

The first clamping circuit 222 is coupled between the first I/O node ION1 and the bit line BL. The first clamping circuit 222 is configured to trim a voltage corresponding to the bit line ($V_{BL}$). The second clamping circuit 223 is coupled between the second I/O node ION2 and the reference bit line RBL. The second clamping circuit 223 is configured to trim a voltage corresponding to the reference bit line ($V_{RBL}$). In detail, the first clamping circuit 222 and the second clamping circuit 223 with trimming correction function(s) (e.g., the trimmable clamping circuit 222 and/or 223) includes a main branch circuit and a plurality of trimming branch circuits. Each trimming branch circuit has a current path and a switch, each switch is for conducting the current path or not and is controlled by the controller 140 in FIG. 1. The controller 140 in FIG. 1 controls a number of the switches in the trimming branch circuits, and sense the voltage $V_{BL}$ corresponding to the bit line BL and the $V_{RBL}$ corresponding to the reference bit line RBL are the same or not, so as to trim the voltage $V_{BL}$ and the $V_{RBL}$ to be the same voltage level.

In an embodiment of the present disclosure, the difference value between a first output voltage and a second output voltage corresponding to the sensing signal is larger than the difference value between the first input voltage and the second input voltage. Furthermore, the first input voltage is inputted to the voltage comparator via the first I/O node ION1, the second input voltage is inputted to the voltage comparator via the second I/O node ION2, the first output voltage is outputted from the voltage comparator via the first I/O node ION1, and the second output voltage is outputted from the voltage comparator via the second I/O node ION2.

In an embodiment of the present disclosure, the voltage comparator 221 includes a first circuit 310 and a second circuit 320, wherein the first circuit and the second circuit are coupled to the first I/O node ION1 and the second I/O node ION2.

The first circuit 310 includes a first transistor M1, a second transistor M2 and a third transistor M3, wherein a first terminal of the first transistor M1 and a first terminal of the second transistor M2 are coupled to a first reference voltage level (e.g., $V_{DD}$), a control terminal of the first transistor M1, a control terminal of the second transistor M2 and a control terminal of the third transistor M3 are coupled to receive a pre-charge signal PREB, a second terminal of the first transistor M1 and a second terminal of the third transistor M3 are coupled to a connection node between the first I/O node ION1, the first transistor M1 and the third transistor M3, and a second terminal of the second transistor M2 and a first terminal of the third transistor M3 are coupled to a further connection node between the second I/O node ION2, the second transistor M2 and the third transistor M3.

The second circuit 320 includes a fourth transistor M4, a fifth transistor M5, a pair of first p-type transistors PM1 and PM2, a pair of first n-type transistors NM1 and NM2, a pair of second p-type transistors PM3 and PM4, and a pair of second n-type transistors NM3 and NM4. The pair of the first p-type transistors PM1 and PM2 and the pair of the first n-type transistors NM1 and NM2 form a third circuit 321. The pair of the second p-type transistors PM3 and PM4 and the pair of the second n-type transistors NM3 and NM4 form a fourth circuit 322. The third circuit 321 is cross-coupled to the fourth circuit 322, and outputs of the third circuit 321 and the fourth circuit 322 are coupled to the first I/O node ION1 and the second I/O node ION2 respectively.

In more detail, the fourth transistor M4 is coupled to the third circuit 321 and the fourth circuit 322, wherein a first terminal of the fourth transistor M4 is coupled to the first reference voltage level (e.g., $V_{DD}$), a second terminal of the fourth transistor M4 is coupled to a connection node between the fourth transistor M4, the third circuit 321, and the fourth circuit 322, and a control terminal of the fourth transistor M4 is coupled to receive a first enable signal EN1.

Furthermore, the fifth transistor M5 is coupled to the third circuit 321 and the fourth circuit 322, wherein a first terminal of the fifth transistor M5 is coupled to a connection node between the fifth transistor M5, the third circuit 321, and the fourth circuit 322. A second terminal of the fifth transistor M5 is coupled to a second reference voltage level (e.g., ground), and a control terminal of the fifth transistor M5 is coupled to receive a second enable signal EN2.

Moreover, in an embodiment of the present disclosure, as illustrated in FIG. 3A, switches SW1 to SW3 are coupled between the third circuit 321 and the first I/O node ION1, and switches SW4 to SW6 are coupled between the fourth circuit 322 and the second I/O node ION2. The switches SW1 to SW6 may be turned(switched) on/off by the control signal SWEN, and the switches SW1 to SW6 may be turned(switched) on to electrically couple second circuit 320 to the bit line BL and the reference bit line RBL.

In the embodiment of the present disclosure in FIG. 3A, the second circuit 320 is referred to as a voltage comparator with an offset compensation function, wherein the offset needed for the same voltage difference corresponding to a sensing signal being reduced. For example, when the switches SW1 to SW6 are turned on for connecting two terminals thereof, the first input voltage inputted via the first I/O node ION1 and the second input voltage inputted via the second I/O node ION2 are received by terminals of the transistors PM1 to PM4 and NM1 to NM4 connected to the switches SW1 to SW6. And, when the switches SW1 to SW6 are turned off for dis-connecting two terminals thereof, the third circuit 321 and the fourth circuit 322 doubles the voltage difference between the first output voltage outputted via the first I/O node ION1 and the second output voltage outputted via the second I/O node ION2 by using the first circuit 310, the transistors M4 and M5 with the enable signals PREB, EN1, and EN2. Thus, in a situation that the voltage difference between a first input voltage and a second input voltage (inputted via the first I/O node ION1 and the second I/O node ION2) is 5 mV, the obtained voltage difference between a first output voltage and a second output voltage (outputted via the first I/O node ION1 and the second I/O node ION2) would be 10 mV while the voltage difference outputted by the circuit structure (illustrated in FIG. 3B) of the second circuit of the voltage comparator with the same input voltage difference is 5 mV.

Figure 3B:
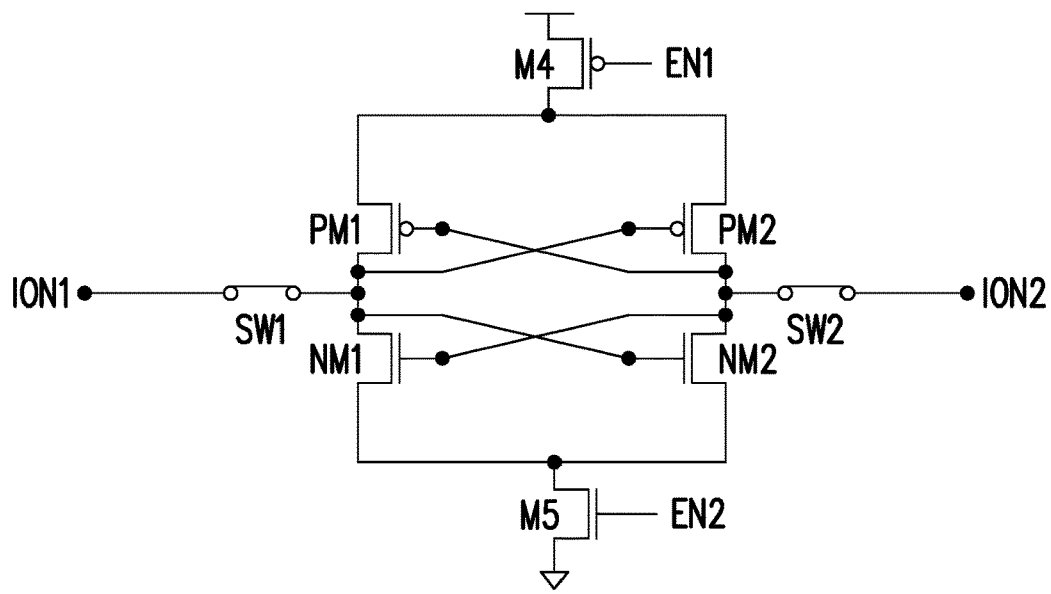
FIG. 3B illustrates a circuit of a voltage comparator of a sense amplifier in accordance with one embodiment.

The circuit structure in FIG. 3B is a voltage comparator. In detail, in a first period, the enable signals EN1 and EN2 are enabled for connecting the source terminals of the transistors PM1, PM2, NM1, and NM2 to VDD/VSS through the transistors M 4 and M5. In a second period, the switches SW1 and SW2 are turned on (i.e., the switches SW1 and SW2 are connected two terminals thereof), and the inputted voltage difference between the first inputted voltage via the first I/O node ION1 and the second inputted voltage via the second I/O node ION2 are inputted to the transistors PM1, PM2, NM1, and NM2, so as to generate output voltage to the first I/O node ION1 and the second I/O node ION2. That is, the offset compensation function of the circuit structure in FIG. 3B may be less than the offset compensation function of the voltage comparator 320 in FIG. 3A and FIG. 3C. Because of the better offset compensation function of the voltage comparator 320, it is easier to determine the voltage difference between voltage provided by the first clamping circuit 122/222 and the voltage provided by the second clamping circuit 123/223. Thus, the risk for occurring the read disturb would be decreased because the voltage difference between the voltages provided by the first clamping circuit and second clamping circuit is easy to be determined. And, because the voltage comparator 121/221 is sensitive for determining the voltage difference between the voltages provided by the first clamping circuit and second clamping circuit, the first and the second clamping circuits 122/222/123/223 do not need to have large number of trimming branch circuits, thus the trimming range and area overhead of trimming circuit (i.e., the first and the second clamping circuits 122/222/123/223) would be correspondingly decreased.

In a further embodiment, the circuit structure of the voltage comparator in FIG. 3B includes a pair of first p-type transistors PM1 and PM2, a pair of first n-type transistors NM1 and NM2, a fourth transistor M4, a fifth transistor M5, and switches SW1 to SW2. For example, after a voltage difference (e.g., $\Delta V$) between a first input voltage and a second input voltage is inputted via the first I/O node ION1 and the second I/O node ION2, and a first enable signal EN1 and a second enable signal EN2 is inputted to turn on the fourth transistor M4 and the fifth transistor M5, the source terminals of p-type transistors PM1 and PM2 are pulled up by the fourth transistor M4, and the source terminals of n-type transistors NM1 and NM2 are pulled down by the fifth transistor M5. Furthermore, positive feedback from the transistors PM1, PM2, NM1 and NM2 is activated, after triggering the first/second enable signal EN1/EN2. Thus, the offset of voltage comparator in FIG. 3B would be 4.6 mV. That is, the offset compensation function of the circuit structure in FIG. 3B may be less than the offset compensation function of the voltage comparator 320 in FIG. 3A and FIG. 3C.

In a further embodiment, the second circuit 320 of FIG. 3A may be further improved by replacing transistors with capacitors. Specifically, referring to FIG. 3C, the second circuit 320 includes a fourth transistor M4, a fifth transistor M5, p-type transistors PM1 to PM5, n-type transistors NM1 to NM5, capacitors C1 to C4, wherein the capacitors C1 and C3, for example, replace the p-type transistors PM1 and PM3 of the second circuit 320 in FIG. 3A, and the capacitors C2 and C4, for example, replace the n-type transistors NM2 and NM4 of the second circuit 320 in FIG. 3A. The p-type transistor PM1 and the n-type transistor NM1 form a third circuit. The p-type transistor PM2 and the n-type transistor NM2 form a fourth circuit. The third circuit is cross-coupled to the fourth circuit, and outputs of the third circuit and the fourth circuit are coupled to the first I/O node ION1 and the second I/O node ION2 respectively. The p-type transistors PM3 to PM5 form a fifth circuit, and the n-type transistors NM3 to NM5 form a sixth circuit.

In more detail, in the fifth circuit, a first terminal of the p-type transistor PM3 and a first terminal of the p-type transistor PM5 are coupled to a first reference voltage level (e.g., $V_{DD}$), a control terminal of the p-type transistor PM3 to PM5 are coupled to receive a first predetermined signal, a second terminal of the p-type transistor PM3 and a second terminal of the p-type transistor PM4 are coupled to a connection node between the first I/O node ION1, the capacitor C1 and the first terminal of p-type transistor PM1, and a second terminal of the p-type transistor PM5 and a first terminal of the p-type transistor PM4 are coupled to a further connection node between the second I/O node ION2, the capacitor C3 and the p-type transistor PM2.

The fourth transistor M4 is coupled to the third circuit, the fourth circuit and the fifth circuit, wherein a first terminal of the fourth transistor M4 is coupled to the first reference voltage level (e.g., $V_{DD}$), a second terminal of the fourth transistor M4 is coupled to a connection node between the capacitor C1 and the capacitor C3, and a control terminal of the fourth transistor M4 is coupled to receive a first enable signal EN1.

Furthermore, the fifth transistor M5 is coupled to the third circuit, the fourth circuit and the sixth circuit, wherein a first terminal of the fifth transistor M5 is coupled to a connection node between the capacitor C2 and the capacitor C4. A second terminal of the fifth transistor M5 is coupled to a second reference voltage level (e.g., ground), and a control terminal of the fifth transistor M5 is coupled to receive a second enable signal EN2.

Moreover, in the sixth circuit, a second terminal of the n-type transistor NM3 and a second terminal of the n-type transistor NM5 are coupled to a second reference voltage level (e.g., ground), a control terminal of the n-type transistor NM3 to NM5 are coupled to receive a second predetermined signal, a first terminal of the n-type transistor NM3 and a second terminal of the n-type transistor NM4 are coupled to a connection node between the first I/O node ION1, the capacitor C2 and the second terminal of n-type transistor NM1, and a first terminal of the n-type transistor NM5 and a first terminal of the n-type transistor NM4 are coupled to a further connection node between the second I/O node ION2, the capacitor C4 and the n-type transistor NM2.

Figure 3C:
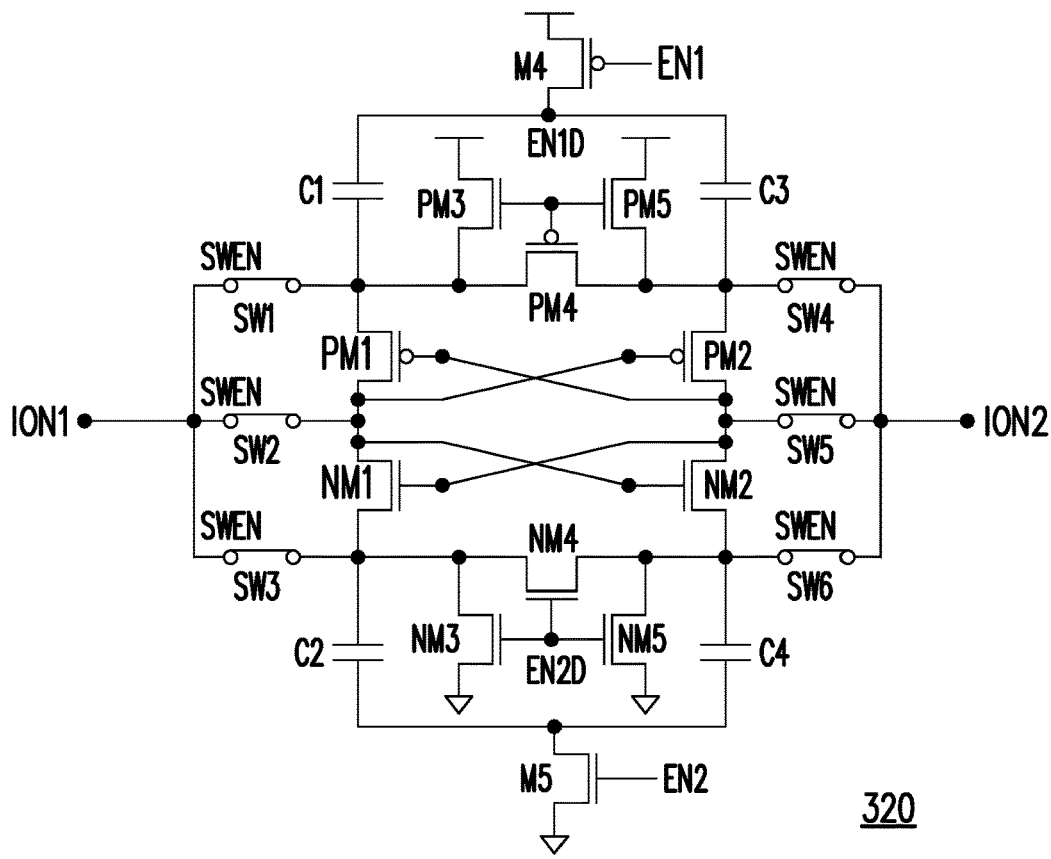
FIG. 3C illustrates an exemplary circuit of a voltage comparator of a sense amplifier, in accordance with some embodiments of the present disclosure.

In addition, as illustrated in FIG. 3C, switches SW1 to SW3 are coupled between the third circuit and the first I/O node ION1, and switches SW4 to SW5 are coupled between the fourth circuit and the second I/O node ION2. The switches SW1 to SW6 may be turned(switched) on/off by the control signal SWEN, and the switches SW1 to SW6 may be turned(switched) on to electrically couple second circuit 320 to the bit line BL and the reference bit line RBL.

In the embodiment of the present disclosure, the second circuit 320 may be referred to as an offset compensation circuit, wherein the offset needed for the same voltage difference corresponding to a sensing signal is further reduced. For example, after a voltage difference (e.g., $\Delta V$) between a first input voltage and a second input voltage is inputted via the first I/O node ION1 and the second I/O node ION2, and a first enable signal EN1 and a second enable signal EN2 is inputted to turn on the fourth transistor M4 and the fifth transistor M5, the source terminals of p-type transistors PM1 and PM2 are pulled up by the fourth transistor M4 via the capacitors C1 and C3, and the source terminals of n-type transistors NM1 and NM2 are pulled down by the fifth transistor M5 via the capacitors C2 and C4. Furthermore, positive feedback from the transistors PM1, PM2, NM1 and NM2 is activated, after triggering the first/second enable signal EN1/EN2, to enlarge the inputted voltage difference (e.g., $\Delta V$), so as to output a larger voltage difference via the first I/O node ION1 and the second I/O node ION2. Moreover, a first enable delay signal EN1D and a second enable delay signal EN2D are provided to supply VDD/VSS to the source terminals of the transistors PM1, PM2, NM1 and NM2 to make the outputted voltage difference rail-to-rail.

The operations for the voltage comparator 320 of FIG. 3C in the embodiment of the present disclosure are described as follows. In a first period, the enable signals EN1 and EN2 are enabled for connecting the source terminals of the transistors PM1, PM2, NM1, and NM2 to VDD/VSS through the transistors M4 and M5 and the capacitors C1 to C4. During the first period, the switches SW1 to SW6 are turned off (i.e., the switches SW1 and SW2 are dis-connected two terminals thereof), and the enable signals EN1D and ED2D are disabled. In a second period, the switches SW1 to SW6 are turned on (i.e., the switches SW1 and SW2 are connected two terminals thereof), the enable signals EN1, EN2, EN1D, and EN2D are disabled, and the inputted voltage difference between the first inputted voltage via the first I/O node ION1 and the second inputted voltage via the second I/O node ION2 are inputted to the transistors PM1, PM2, NM1, and NM2. In a third period, the first enable delay signal EN1D and the second enable delay signal EN2D are enabled, the switches SW1 to SW6 are turned on (i.e., the switches SW1 and SW2 are connected two terminals thereof) and the enable signals EN1 and EN2 are disabled, and the output voltages are generated to the first I/O node ION1 and the second I/O node ION2 by the capacitors C1 to C4 and transistors PM1 to PM 5 and NM1 to NM5. In other words, the circuit structure of the capacitors C1 to C4 and transistors PM1 to PM5 and NM1 to NM5 form a structure of charge pump function, and the output voltage difference between the first output voltage outputted via the first I/O node ION1 and the second output voltage outputted via the second I/O node ION2 is doubled by the first period to the third period. In an embodiment, the desired offset would be further reduced by 8% (e.g., from 3.8 mV/σ to 3.5 mV/σ). That is, the offset compensation function of the circuit structure in FIG. 3B may be less than the offset compensation function of the voltage comparator 320 in FIG. 3C.

In some embodiments of the present disclosure, the capacitor(s) is used for storing electric charges corresponding to the input voltage difference, and the electric charges stored in the capacitor(s) would be discharged to eliminate the device mismatch during the sensing phase. In detail, while the first/second enable signal EN1/EN2 are not triggered (i.e., the first/second enable signal EN1/EN2 are disabled), in order to keep voltages with two terminals of the capacitors C1 to C4, the capacitors C1 to C4 store the electric charges corresponding to the input voltage difference. And, while the first/second enable signal EN1/EN2 are triggered (i.e., the first/second enable signal EN1/EN2 are enabled), the electric charges stored in the capacitors C1 to C4 would be discharged to eliminate the device mismatch during the sensing phase.

Figure 3D:
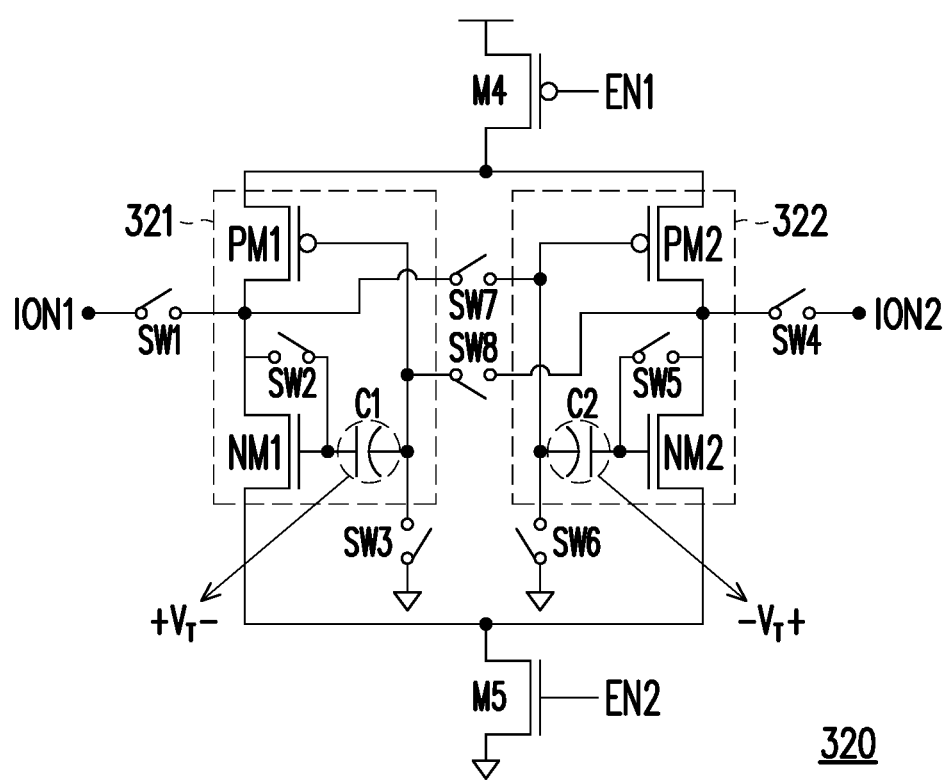
FIG. 3D illustrates an exemplary circuit of a voltage comparator of a sense amplifier, in accordance with some embodiments of the present disclosure.

Referring to FIG. 3D, in an embodiment, the second circuit 320 includes a fourth transistor M4, a fifth transistor M5, p-type transistors PM1 and PM2, n-type transistors NM1 and NM2, capacitors C1 and C2, and switches SW1 to SW8. The capacitor C1, the p-type transistor PM1 and the n-type transistor NM1 form a third circuit 321. The capacitor C2, the p-type transistor PM2 and the n-type transistor NM2 form a fourth circuit 322. The third circuit is cross-coupled to the fourth circuit by switches SW7 and SW8, and outputs of the third circuit and the fourth circuit are coupled to the first I/O node ION1 and the second I/O node ION2 respectively.

In more detail, the fourth transistor M4 is coupled to the third circuit 321 and the fourth circuit 322, wherein a first terminal of the fourth transistor M4 is coupled to the first reference voltage level (e.g., $V_{DD}$), a second terminal of the fourth transistor M4 is coupled to a connection node between the fourth transistor M4, the third circuit 321, and the fourth circuit 322, and a control terminal of the fourth transistor M4 is coupled to receive a first enable signal EN1. Furthermore, the fifth transistor M5 is coupled to the third circuit 321 and the fourth circuit 322, wherein a first terminal of the fifth transistor M5 is coupled to a connection node between the fifth transistor M5, the third circuit 321, and the fourth circuit 322. A second terminal of the fifth transistor M5 is coupled to a second reference voltage level (e.g., ground), and a control terminal of the fifth transistor M5 is coupled to receive a second enable signal EN2.

A first terminal of the capacitor C1 is coupled to a first connection node between the p-type transistor PM2 and the n-type transistor NM2 via the switch SW8, and a second terminal of the capacitor C1 is coupled to a second connection node between the p-type transistor PM1 and the n-type transistor NM1 via the switch SW2, and coupled to a control terminal of the n-type transistor NM1. A first terminal of the capacitor C2 is coupled to the second connection node between the p-type transistor PM1 and the n-type transistor NM1 via the switch SW7, a second terminal of the capacitor C2 is coupled to the first connection node between the p-type transistor PM2 and the n-type transistor NM2 via the switch SW5, and coupled to a control terminal of the n-type transistor NM2.

The switch SW1 is coupled between the first I/O node ION1 and the second connection node, and the switch SW4 is coupled between the second I/O node ION2 and the first connection node. In addition, the switch SW3 is coupled between the second reference voltage level (e.g., ground) and the first terminal of the capacitor C1, and the switch SW6 is coupled between the second reference voltage level (e.g., ground) and the first terminal of the capacitor C2.

The operations of the circuit structure in FIG. 3D are described as follows. In a first period, the enable signals EN1 and EN2 are enabled for connecting the source terminals of the transistors PM1, PM2, NM1, and NM2 to VDD/VSS through the transistors M4 and M5, and the switches SW2 to SW3 and SW5 to SW8 are turned on. In a second period, the switches SW1 and SW4 are turned on (i.e., the switches SW1 and SW2 are connected two terminals thereof), and the inputted voltage difference between the first inputted voltage via the first I/O node ION1 and the second inputted voltage via the second I/O node ION2 are inputted to the transistors PM1, PM2, NM1, and NM2, so as to generate output voltage to the first I/O node ION1 and the second I/O node ION2. During the second period, the switches SW2 to SW3 and SW5 to SW8 are turned on. In a third period, the switches SW2 to SW3 and SW5 to SW8 are turned off, the switches SW1 and SW4 are turned on, and the enable signals EN1 and EN2 are disabled, and the output voltages are generated to the first I/O node ION1 and the second I/O node ION2 by the capacitors C1 to C4 and transistors PM1 to PM5 and NM1 to NM5. In other words, the circuit structure of the capacitors C1 to C2 and transistors PM1 to PM2 and NM1 to NM2 form a structure of charge pump function, and the output voltage difference between the first output voltage outputted via the first I/O node ION1 and the second output voltage outputted via the second I/O node ION2 is doubled by the first period to the third period.

Figure 3E:
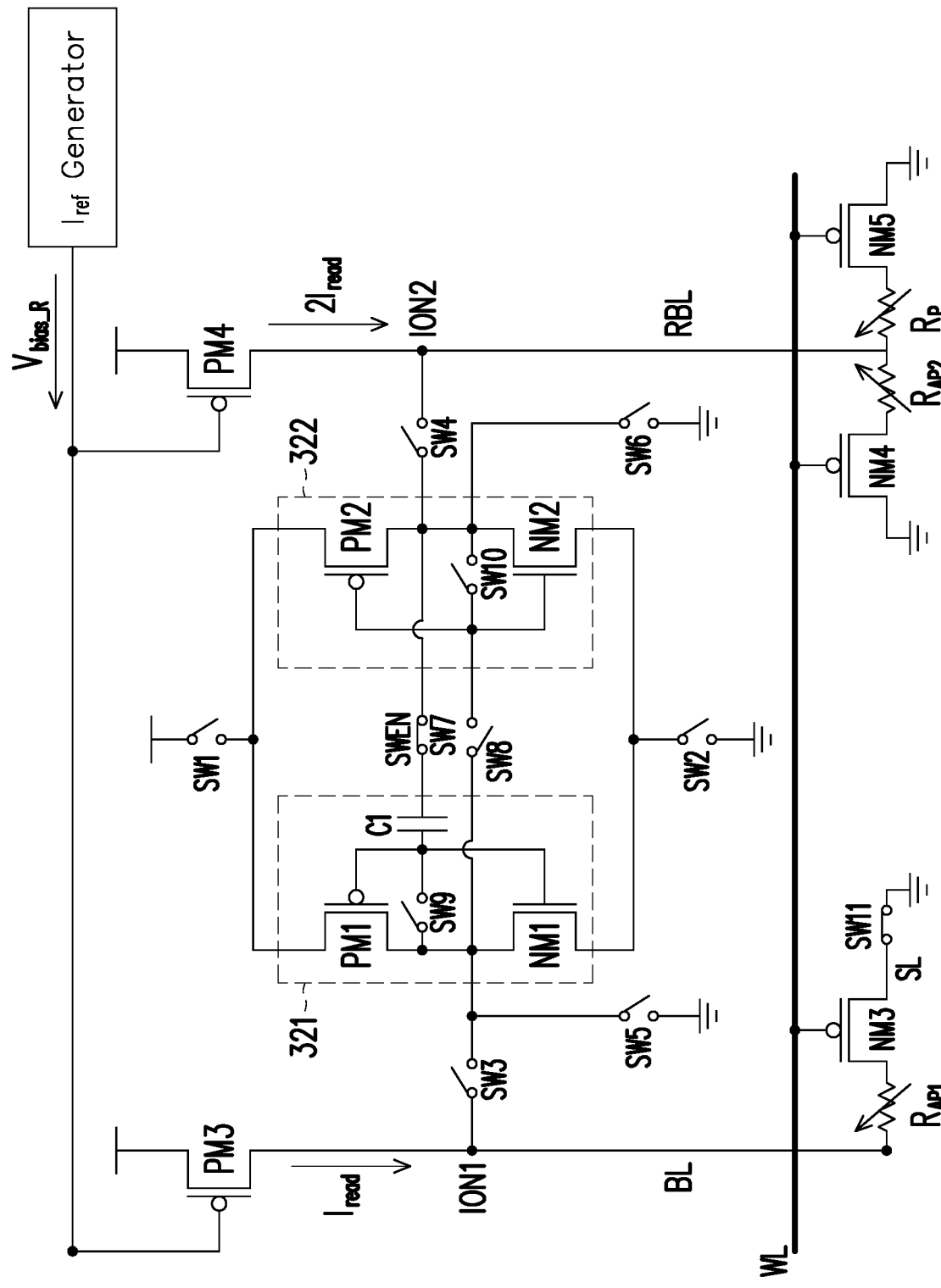
FIG. 3E illustrates an exemplary circuit of a voltage comparator of a sense amplifier, in accordance with some embodiments of the present disclosure.

Referring to FIG. 3E, in a further embodiment, the second circuit 320 includes p-type transistors PM1 and PM2, n-type transistors NM1 and NM2, capacitor C1, and switches SW1 to SW10. The capacitor C1, the p-type transistor PM1 and the n-type transistor NM1 form a third circuit 321. The p-type transistor PM2 and the n-type transistor NM2 form a fourth circuit 322. The third circuit is cross-coupled to the fourth circuit by switches SW7 and SW8, and outputs of the third circuit and the fourth circuit are coupled to the first I/O node ION1 and the second I/O node ION2 respectively.

In more detail, the switch SW1 is coupled to the third circuit 321 and the fourth circuit 322, wherein a first terminal of the switch SW1 is coupled to the first reference voltage level (e.g., $V_{DD}$), a second terminal of the switch SW1 is coupled to a connection node between the third circuit 321 (p-type transistor PM1) and the fourth circuit 322 (p-type transistor PM2). Furthermore, the switch SW2 is coupled to the third circuit 321 and the fourth circuit 322, wherein a second terminal of the switch SW2 is coupled to the second reference voltage level (e.g., ground), a first terminal of the switch SW2 is coupled to a connection node between the third circuit 321 (n-type transistor NM1) and the fourth circuit 322 (n-type transistor NM2).

A first terminal of the capacitor C1 is coupled to a first connection node between the p-type transistor PM2 and the n-type transistor NM2 via the switch SW7, and a second terminal of the capacitor C1 is coupled to a connection node between the p-type transistor PM1, the n-type transistor NM1, and the switch SW9.

The switch SW3 is coupled between the first I/O node ION1 and a second connection node, and the switch SW4 is coupled between the second I/O node ION2 and the first connection node. In addition, the switch SW5 is coupled between the second reference voltage level (e.g., ground) and the second connection node, and the switch SW6 is coupled between the second reference voltage level (e.g., ground) and the first connection node.

In addition, the switch SW10 is coupled between the first connection node and a connection node between the control terminals of the p-type transistor PM2 and the n-type transistor NM2; and the switch SW9 is coupled between the second connection node and a connection node between the control terminals of the p-type transistor PM1 and the n-type transistor NM1.

In FIG. 3E, the second circuit 320 further includes p-type transistors PM3 and PM4, n-type transistors NM3 to NM5, a reference current generator, resistors RAP1, RAP2, and RP. The output node of the reference current generator is coupled to control terminals of the p-type transistors PM3 and PM4. The p-type transistors PM3 and PM4 generate Iread and 2Iread respectively according to a bias voltage Vbias_R generated by the output node of the reference current generator. The first I/O node ION1 is coupled to one node of the third switch SW3 and the bit line BL, and the second I/O node ION2 is coupled to one node of the fourth switch SW4 and the reference bit line RBL. The control terminals of the n-type transistors NM3 to NM5 are coupled to the word line WL. The drain terminal of the n-type transistor NM3 is coupled to the bit line BL through the resistor RAP1, and the source terminal of the n-type transistor NM3 is coupled to the ground terminal through the switch SW11. The drain terminal of the n-type transistor NM4 is coupled to the reference bit line RBL through the resistor RAP2, and the source terminal of the n-type transistor NM4 is coupled to the ground terminal. The drain terminal of the n-type transistor NM5 is coupled to the reference bit line RBL through the resistor RP, and the source terminal of the n-type transistor NM5 is coupled to the ground terminal.

The operations for the voltage comparator 320 of FIG. 3E in the embodiment of the present disclosure are described as follows. In a first period, the switches SW1 to SW2 and SW5 to SW6 are turned on for connecting the source terminals of the transistors PM1, PM2, NM1, and NM2 to VDD/VSS. During the first period, the switches SW3 to SW4 and SW7 to SW10 are turned on. In a second period, the $I_{ref}$ Generator generates the bias voltage $V_{bias\_R}$ to generate the current $I_{read}$ and $2I_{read}$ respectively according to the bias voltage $V_{bias\_R}$, so as to generate the first input voltage and a second input voltage inputted via the first I/O node ION1 and the second I/O node ION2. During the second period, the switches SW7 to SW10 are still turned on. In a third period, the switches SW7 to SW10 are turned off, and the switches SW3 to SW4 are turned on. During the third period, because there is voltage difference between two terminals of the capacitor C1, the difference value between the first output voltage via the I/O node ION1 and the second output voltage via the I/O node ION2 is been pushed away according to the voltage difference of the capacitor C1, such that the voltage differences for the bit line BL and the reference bit line RBL are more easy to determined.

As illustrated in FIG. 3A, each of the trimmable clamping circuit may have a main branch circuit and a plurality of trimming branch circuits. Each trimming branch circuit has a current path and a switch, each switch is for conducting the current path or not and is controlled by the controller 140 in FIG. 1. The controller 140 in FIG. 1 controls a number of the switches in the trimming branch circuits, and sense the voltage $V_{BL}$ corresponding to the bit line BL and the $V_{RBL}$ corresponding to the reference bit line RBL are the same or not, so as to trim the voltage $V_{BL}$ and the $V_{RBL}$ to be the same voltage level.

Figure 4A:
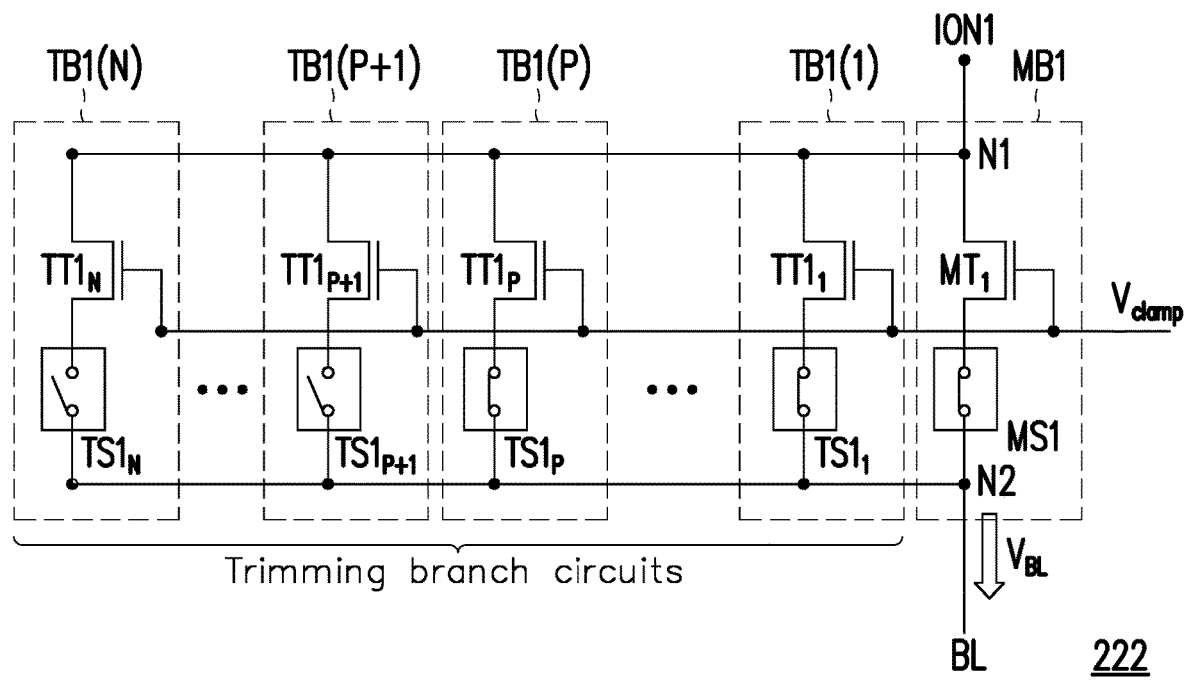
FIG. 4A illustrates a schematic diagram of a trimmable first clamping circuit, in accordance with some embodiments of the present disclosure.

For example, referring to FIG. 4A, the first clamping circuit 222 includes a first main branch circuit MB1 and a plurality of first trimming branch circuits TB1(1)-TB1(N). The first main branch circuit MB1 includes a first main transistor MT1 having a first terminal, a second terminal and a control terminal and a first main switch MS1. The first terminal of the first main transistor MT1 is coupled to a first connection node N1 between the first I/O node ION1 and the first clamping circuit 222, and the control terminal of the first main transistor MT1 is coupled to receive a clamping voltage ($V_{clamp}$). The first main switch MS1 is coupled between the second terminal of the first main transistor MT1 and the bit line BL, wherein the first main switch MS1 is switched on to electrically couple the bit line BL to the first main transistor MT1, and the first main switch MS1 is switched off to electrically isolate the bit line BL from the first main transistor MT1.

Each of the first trimming branch circuits TB1(1)-TB1(N) includes a first trimming transistor TT1 having a first terminal, a second terminal and a control terminal and a first trimming switch TS1. The first terminal of the first trimming transistor TT1 is coupled to the first connection node N1, and the control terminal of the first trimming transistor TT1 is coupled to receive the clamping voltage ($V_{clamp}$). The first trimming switch TS1 is coupled between the second terminal of the first trimming transistor TT1 and a second connection node N2 between the first main switch MS1 and the bit line BL, wherein the first trimming switch TS1 is switched on to electrically couple the bit line BL to the first trimming transistor TT1, and the first trimming switch TS1 is switched off to electrically isolate the bit line BL from the first trimming transistor TT1.

Figure 4B:
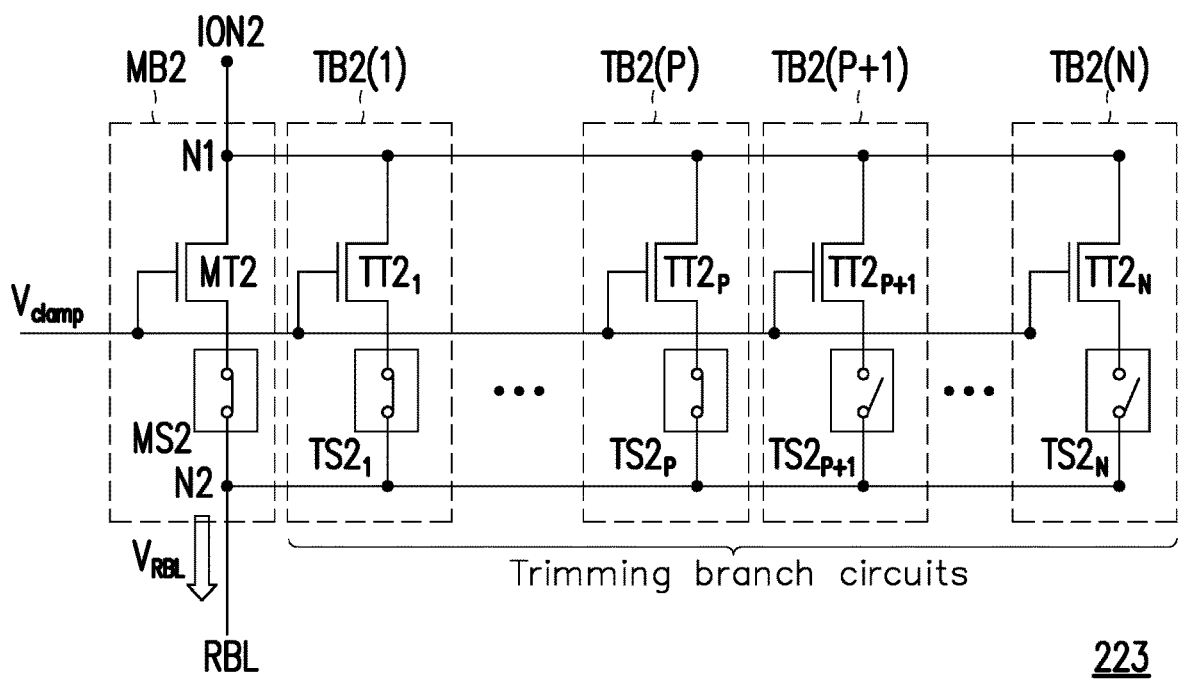
FIG. 4B illustrates a schematic diagram of a trimmable second clamping circuit, in accordance with some embodiments of the present disclosure.

Similarly, referring to FIG. 4B, the second clamping circuit 223 includes a second main branch circuit MB2 and a plurality of second trimming branch circuits TB2(1)-TB2(N). The second main branch circuit MB2 includes a second main transistor MT2 having a first terminal, a second terminal and a control terminal and a second main switch MS2. The first terminal of the second main transistor MT2 is coupled to a first connection node N1 between the second I/O node ION2 and the second clamping circuit 223, and the control terminal of the second main transistor MT2 is coupled to receive a clamping voltage ($V_{clamp}$). The second main switch MS2 is coupled between the second terminal of the second main transistor MT2 and the reference bit line RBL, wherein the second main switch MS2 is switched on to electrically couple the reference bit line RBL to the second main transistor MT2, and the second main switch MS2 is switched off to electrically isolate the bit line BL from the second main transistor MT2.

Each of the second trimming branch circuits TB2(1)-TB2(N) includes a second trimming transistor TT2 having a first terminal, a second terminal and a control terminal and a second trimming switch TS2. The first terminal of the second trimming transistor TT2 is coupled to the first connection node N1, and the control terminal of the second trimming transistor TT2 is coupled to receive the clamping voltage ($V_{clamp}$). The second trimming switch TS2 is coupled between the second terminal of the second trimming transistor TT2 and a second connection node N2 between the second main switch MS2 and the reference bit line RBL, wherein the second trimming switch TS2 is switched on to electrically couple the reference bit line RBL to the second trimming transistor TT2, and the second trimming switch TS2 is switched off to electrically isolate the reference bit line RBL from the second trimming transistor TT2.

It should be mentioned that, in the embodiment of the present disclosure, N represents the total amount of the trimming branch circuits and P is a default value representing the predetermined amount of the turned-on trimming branch circuits. in one embodiment of the disclosure, P may be set as '8' and N may be set as '16'. In other words, the amount of the initially turned-on first trimming branch circuits in the first clamping circuit 222 is 8, i.e., first trimming branch circuits TB1(1)-TB1(8) are turned on; the amount of the initially turned-on second trimming branch circuits in the second clamping circuit 222 is 8, i.e., second trimming branch circuits TB2(1)-TB2(8) are turned on. Those who implementing the embodiment of the disclosure may set P and N as other numbers. For example, P may be set as one of the number '1' to '16' and N may be set as '16'. In the other embodiments, P may be set as one of the number '1' to '32' and N may be set as '32'.

In an embodiment, the first main branch MB1 may not include the first main switch MS1, and the second main branch MB2 may not include the second main switch MS2. In other words, in this embodiment, the second terminal of the first/second main transistor MT1/MT2 is coupled to the second connection node N2.

In the embodiment, the voltage (e.g., $V_{BL}$) corresponding to the bit line BL is trimmed by turning-on or turning-off one or more of the first trimming switches $TS1_1$-$TS1_N$, and the trimmed voltage corresponding to the bit line BL is proportional to the total number of currently turned-on first trimming switches of the first clamping circuit 222. Furthermore, the voltage (e.g., $V_{RBL}$) corresponding to the reference bit line RBL is trimmed by turning-on or turning-off one or more of the second trimming switches $TS2_1$-$TS2_N$, and the trimmed voltage corresponding to the reference bit line RBL is proportional to the total number of currently turned-on second trimming switches of the second clamping circuit 223. In the embodiment, the controller 120 in FIG. 2 may sense the sensing signal outputted from the first I/O node ION1 and the second I/O node ION2 to control the first trimming switches $TS1_1$-$TS1_N$ and the second trimming switches $TS2_1$-$TS2_N$ in FIG. 4A and FIG. 4B for adjusting/trimming the voltages on the first I/O node ION1 and the second I/O node ION2 according to the sensing signal. In the embodiment, the controller 120 in FIG. 2 may use the step-by-step fine adjustment scenario or the binary approximation fine adjustment scenario for determining whether the second trimming switches $TS2_1$-$TS2_N$ are turning-on or turning-off, in other words, for determining the number of second trimming switches $TS2_1$-$TS2_N$ are turning-on and other second trimming switches $TS2_1$-$TS2_N$ are turning-off.

Referring back to FIG. 3A, the sense amplifier 220 further includes a first resistor $R_{BL}$ and a second resistor $R_{RBL}$. The first resistor $R_{BL}$ is coupled between the first clamping circuit 222 and the bit line BL, and the second resistor $R_{RBL}$ is coupled between the second clamping circuit 223 and the reference bit line RBL. The first resistor $R_{BL}$ may be the equivalent resistance for the memory cell 112 in FIG. 1, and the second resistor $R_{BL}$ may be the equivalent resistance for the reference cell 114 in FIG. 1.

Figure 5:
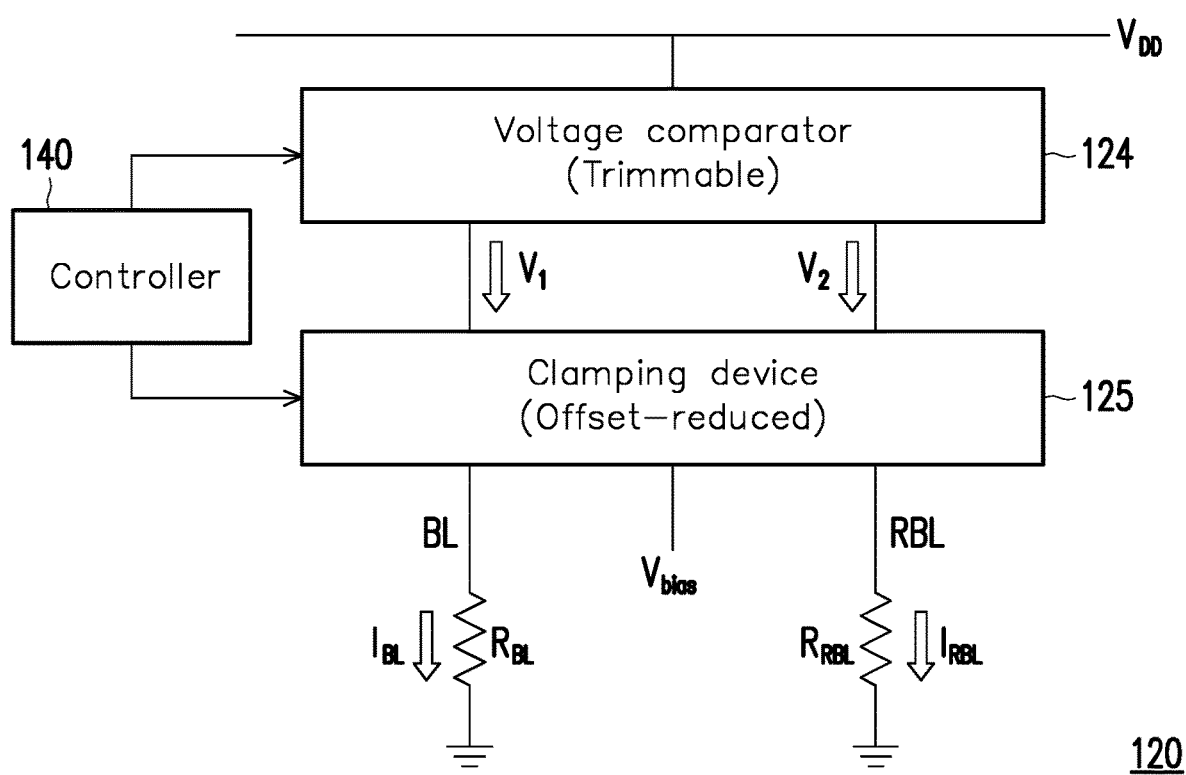
FIG. 5 illustrates a schematic block diagram of a sense amplifier, in accordance with some embodiments of the present disclosure.
Figure 6:
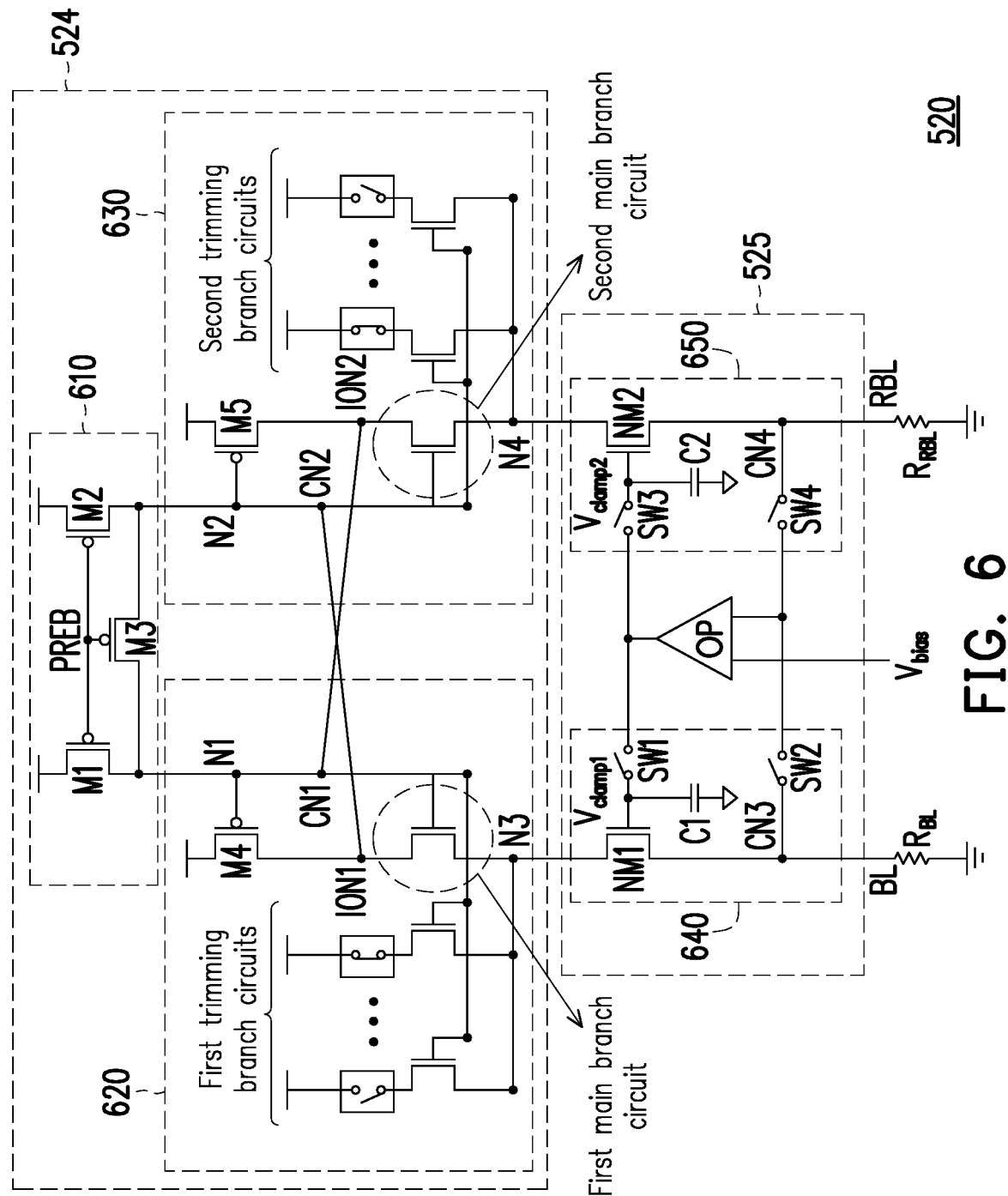
FIG. 6 illustrates a schematic diagram of a sense amplifier, in accordance with some embodiments of the present disclosure.

Referring to FIG. 5 and FIG. 6, in an embodiment of the present disclosure, the sense amplifier 120 includes a voltage comparator 124 having a trimming correction function (e.g., trimmable voltage comparator) and a clamping device 125 having a reducing offset function (e.g., offset-compensation clamping device). More specifically, the sense amplifier 120 includes a voltage comparator 124 and a clamping device 125. The voltage comparator 124 is coupled to a bit line BL and a reference bit line RBL, and configured to compare a first input voltage and a second input voltage to output a sensing signal. The clamping device 125 is coupled between the voltage comparator 124, the bit line BL and the reference bit line RBL. The sense amplifier 120 further includes a controller 140. The controller 140 may couple to the voltage comparator 124 and the clamping device 125 for controlling switches into the voltage comparator 124 and the clamping device 125, so as to implement the functions of the voltage comparator 124 and the clamping device 125. In detail, one example of the voltage comparator 124 is the voltage comparator 524 in FIG. 6, and there are a plurality of switches in the first trimming branch circuits and in the second trimming branch circuits. The controller 120 in FIG. 2 may use the step-by-step fine adjustment scenario or the binary approximation fine adjustment scenario for determining whether each of the first trimming branch circuits and each of the second trimming branch circuits are turned on or turned off.

Furthermore, referring to FIG. 5, the voltage comparator 124 is further configured to trim a first voltage V1 corresponding to the bit line BL, and to trim a second voltage V2 corresponding to the reference bit line RBL, and the clamping device 125 is configured to provide a first clamping voltage and a second clamping voltage according to a bias voltage $V_{bias}$ inputted to the clamping device 125. In detail, the clamping device 125 needs a reference voltage to know the voltages on the bit line BL and on the reference bit line RBL has a offset voltage difference or not according the bias voltage $V_{bias}$ for implementing the offset compensation function. The first input voltage and the second input voltage are inputted to a first I/O node and a second I/O node respectively, and a first output voltage and a second output voltage corresponding to the sensing signal are outputted from the first I/O node and the second I/O node of the sense amplifier 120 respectively.

In an embodiment of the present disclosure, the voltage comparator 524 includes: a first circuit 610, a second circuit 620 and a third circuit 630. The second circuit 620 is cross-coupled to the third circuit 630 via the first I/O node ION1, the second I/O node ION2, first connection node CN1 and second connection node CN2.

The first circuit includes a first transistor M1, a second transistor M2 and a third transistor M3. A first terminal of the first transistor M1 and a first terminal of the second transistor M2 are coupled to a first reference voltage level (e.g., $V_{DD}$), a control terminal of the first transistor M1, a control terminal of the second transistor M2 and a control terminal of the third transistor M3 are coupled to receive a pre-charge signal PREB, a second terminal of the first transistor M1 and a second terminal of the third transistor M3 are coupled to a connection node between a first node N1, the first transistor M1 and the third transistor M3, and a second terminal of the second transistor M2 and a first terminal of the third transistor M3 are coupled to a further connection node between a second node N2, the second transistor M2 and the third transistor M3.

The second circuit 620 includes a fourth transistor M4, a first main branch circuit (as indicated in FIG. 6, a n-type transistor); and a plurality of first trimming branch circuits. A first terminal of the fourth transistor M4 is coupled to the first reference voltage level, a control terminal of the fourth transistor M4 is coupled to the first node N1, and a second terminal of the fourth transistor M4 is coupled to the first main branch circuit via the first I/O node ION1. The second terminals of the first trimming branch circuits are coupled to a second terminal of the first main branch circuit via a third node N3, the control terminals of the first trimming branch circuits are coupled to a control terminal of the n-type transistor of the first main branch circuit.

The third circuit 630 includes a fifth transistor M5, a second main branch circuit (as indicated in FIG. 6, a n-type transistor in third circuit 630); and a plurality of second trimming branch circuits. A first terminal of the fifth transistor M5 is coupled to the first reference voltage level, a control terminal of the fifth transistor M5 is coupled to the second node N2, and a second terminal of the fifth transistor M5 is coupled to the second main branch circuit via the second I/O node ION2. The second terminals of the second trimming branch circuits are coupled to a second terminal of the second main branch circuit via a fourth node N4, the control terminals of the second trimming branch circuits are coupled to a control terminal of the n-type transistor of the second main branch circuit.

It should be mentioned that, the third circuit 620 and the fourth circuit 630 of the voltage comparator 524 both have the trimming circuits (e.g., the first trimming branch circuits and the second trimming branch circuit), but the present disclosure is not limited hereto. For example, in another embodiment, only the third circuit 620 or the fourth circuit 630 may have the trimming circuits. In other words, in another embodiment, the voltage comparator 524 may provide trimming correction function only by the third circuit 620 or the fourth circuit 630 having the trimming circuits. The detail of the trimming circuits is described below with FIG. 7A and FIG. 7B.

Figure 7A:
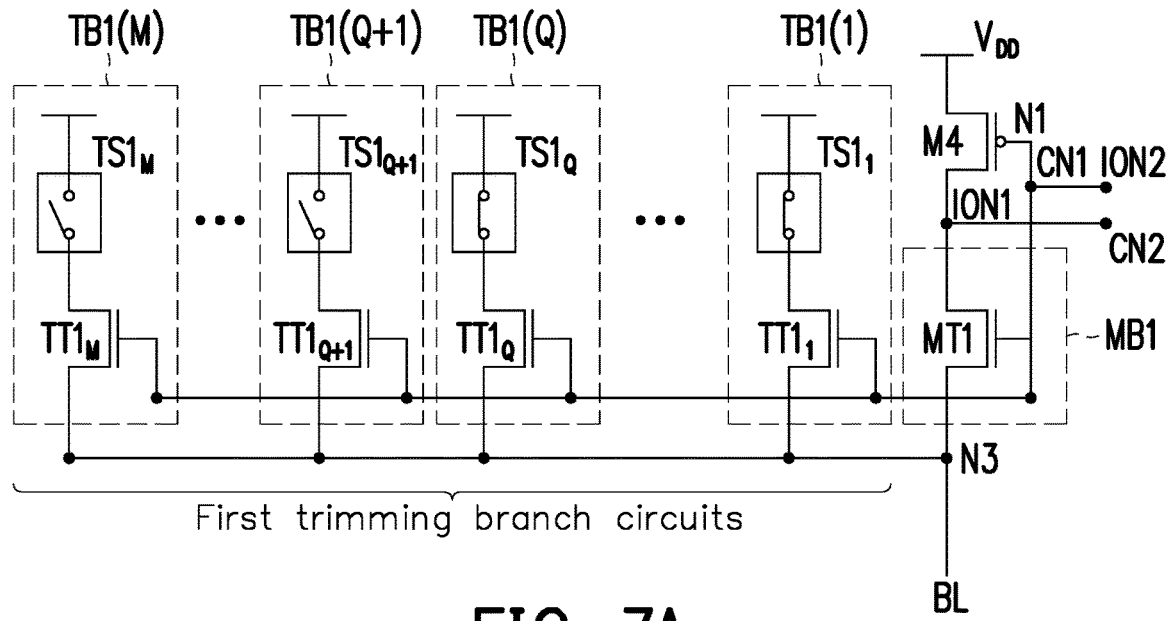
FIG. 7A illustrates an exemplary circuit of a trimmable voltage comparator, in accordance with some embodiments of the present disclosure.

Referring to FIG. 7A, the first main branch circuit MT1 of the third circuit 620 includes a first main transistor MT1, wherein a first terminal of the first main transistor MT1 is coupled to the first I/O node ION1, a control terminal of the first main transistor MT1 is coupled to a first connection node CN1 between the first node N1 and the second I/O node ION2, and a second terminal of the first main transistor MT1 is coupled to the third node N3.

Each of the first trimming branch circuits TB1(1)-TB1(M) includes a first trimming switch TS1 and a first trimming transistor TT1, wherein a first terminal of the first trimming transistor TT1 is coupled to the first trimming switch TS1, a control terminal of the first trimming transistor TT1 is coupled to the first connection node CN1, and a second terminal of the first trimming transistor TT1 is coupled to the third node N3.

The first trimming switch TS1 is coupled between the first terminal of the first trimming transistor TT1 and the first reference voltage level (e.g., $V_{DD}$), wherein the first trimming switch TS1 is switched on to electrically couple the first reference voltage level to the first trimming transistor TT1, and the first trimming switch TS1 is switched off to electrically isolate the first reference voltage level from the first trimming transistor TT1. The voltage corresponding to the third node N3 is trimmed by turning-on or turning-off one or more of the first trimming switches TS1, and the trimmed voltage corresponding to the third node N3 is proportional to the total number of currently turned-on first trimming switches TS1 of the third circuit 620.

Figure 7B:
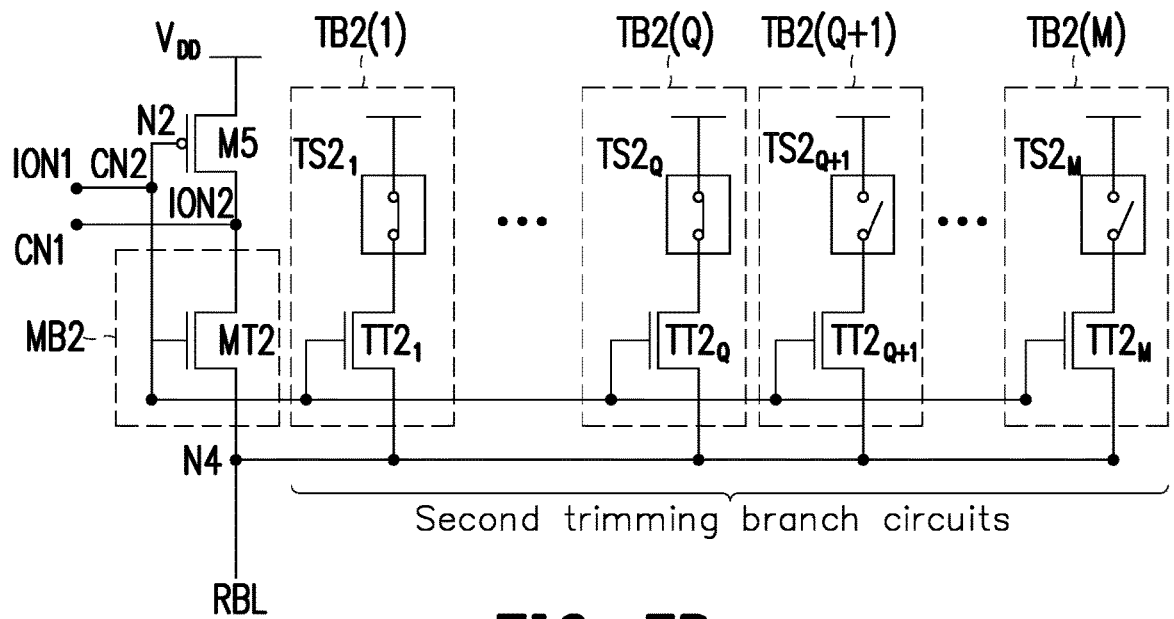
FIG. 7B illustrates an exemplary circuit of a trimmable voltage comparator, in accordance with some embodiments of the present disclosure.

Similarly, referring to FIG. 7B, the second main branch circuit MT2 of the fourth circuit 630 includes a second main transistor MT2, wherein a first terminal of the second main transistor MT2 is coupled to the second I/O node ION2, a control terminal of the second main transistor MT2 is coupled to a second connection node CN2 between the second node N2 and the first I/O node ION1, and a second terminal of the second main transistor MT2 is coupled to the fourth node N4.

Each of the second trimming branch circuits TB2(1)-TB2(M) includes a second trimming switch TS2 and a second trimming transistor TT2, wherein a first terminal of the second trimming transistor TT2 is coupled to the second trimming switch TS2, a control terminal of the second trimming transistor TT2 is coupled to the second connection node CN2, and a second terminal of the second trimming transistor TT2 is coupled to the fourth node N4.

The second trimming switch TS2 is coupled between the first terminal of the second trimming transistor TT2 and the first reference voltage level (e.g., $V_{DD}$), wherein the second trimming switch TS2 is switched on to electrically couple the first reference voltage level to the second trimming transistor TT2, and the second trimming switch TS2 is switched off to electrically isolate the first reference voltage level from the second trimming transistor TT2. The voltage corresponding to the fourth node N4 is trimmed by turning-on or turning-off one or more of the second trimming switches TS2, and the trimmed voltage corresponding to the fourth node N4 is proportional to the total number of currently turned-on second trimming switches TS2 of the fourth circuit 630.

It should be mentioned that, in the embodiment of the present disclosure, M represents the total amount of the trimming branch circuits and Q is a default value representing the predetermined amount of the turned-on trimming branch circuits. In one embodiment, Q may be set as '4' and M may be set as '8'. In other words, the amount of the initially turned-on first trimming branch circuits in the third circuit 620 is 4, i.e., first trimming branch circuits TB1(1)-TB1(4) are turned on; the amount of the initially turned-on second trimming branch circuits in the fourth circuit 630 is 4, i.e., second trimming branch circuits TB2(1)-TB2(4) are turned on. Those who implementing the embodiment of the disclosure may set Q and M as other numbers. For example, Q may be set as one of the number '1' to '8' and M may be set as '8'. In the other embodiments, Q may be set as one of the number '1' to '16' and M may be set as '16'.

In the embodiment, the voltage (e.g., the voltage corresponding to third node N3) corresponding to the bit line BL is trimmed by turning-on or turning-off one or more of the first trimming switches $TS1_1$-$TS1_N$, and the trimmed voltage corresponding to the bit line BL is proportional to the total number of currently turned-on first trimming switches of first trimming branch circuits TB1(1)-TB1(M) of the third circuit 620. Furthermore, the voltage (e.g., the voltage corresponding to fourth node N4) corresponding to the reference bit line RBL is trimmed by turning-on or turning-off one or more of the second trimming switches $TS2_1$-$TS2_N$, and the trimmed voltage corresponding to the reference bit line RBL is proportional to the total number of currently turned-on second trimming switches of second trimming branch circuits TB2(1)-TB2(M) of the fourth circuit 630.

It should be noted, since the clamping device 525 provide a reducing offset function to compensate the mismatch between transistor NM1 and transistor NM2 controlled by the controller 140 in FIG. 5 with the step-by-step fine adjustment scenario or the binary approximation fine adjustment scenario, the needed trimming step/range may be decreased. Therefore, the total amount of the trimming branch circuits (i.e., M) in the trimmable voltage comparator in FIG. 6 may be set as the values less than the total amount of the trimming branch circuits (i.e., N) in the trimmable clamping circuit in FIG. 3A; and the amount of initially turned-on trimming branch circuits (i.e., Q) in the trimmable voltage comparator in FIG. 6 may be set as the values less than the amount of initially turned-on trimming branch circuits (i.e., P) in the trimmable clamping circuit in FIG. 3A.

Figure 8A:
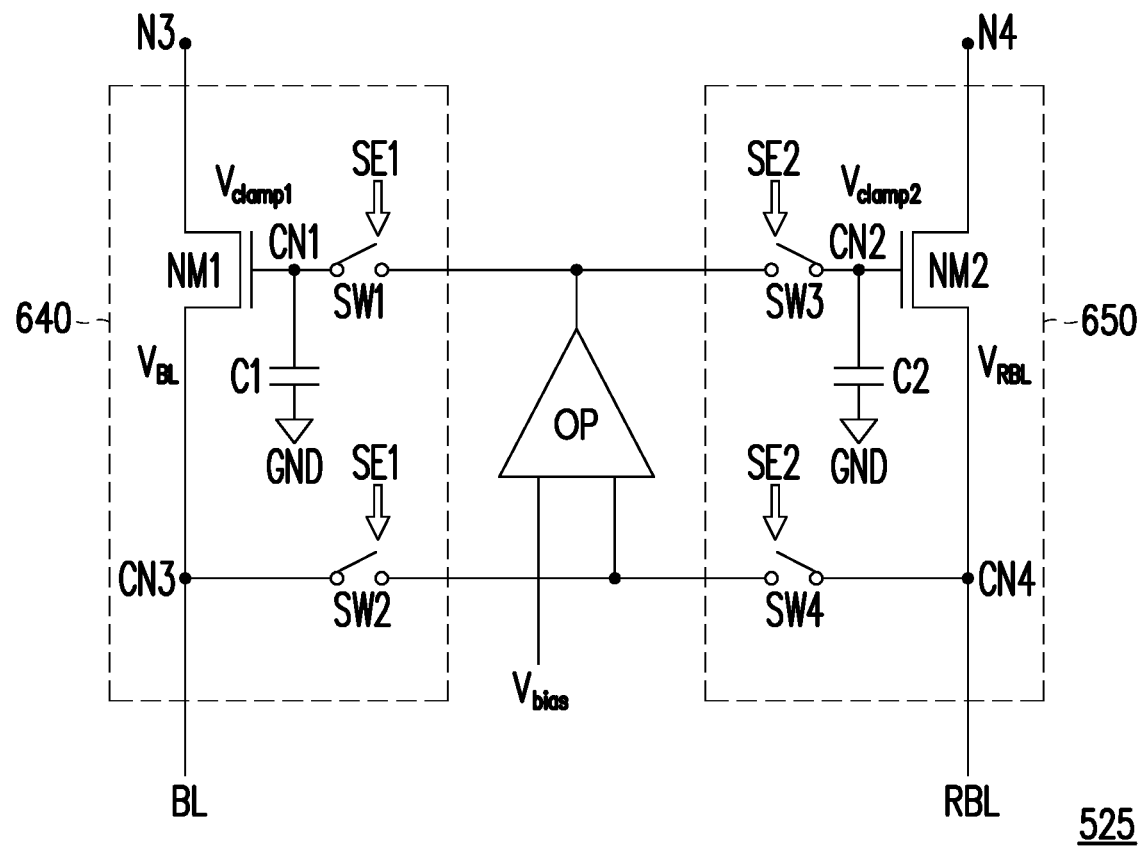
FIG. 8A illustrates a schematic diagram of an offset-compensation clamping device, in accordance with some embodiments of the present disclosure.

Referring to FIG. 6 and FIG. 8A, the clamping device 525 includes a first clamping circuit 640, a second clamping circuit 650 and an operation amplifier OP. The first clamping circuit 640 is coupled between the voltage comparator 524 and the bit line BL. The second clamping circuit 650 is coupled between the voltage comparator 524 and the reference bit line RBL.

The operational amplifier OP has an output terminal, a first input terminal, and a second input terminal, wherein the output terminal is coupled to a connection node between the first clamping circuit 640 and the second clamping circuit 650, the first input terminal is coupled to receive the bias voltage (e.g., $V_{bias}$), and the second input terminal is coupled to a further connection node between the first clamping circuit 640 and the second clamping circuit 650.

The first clamping circuit 640 includes a first transistor NM1, a first switch SW1, a second switch SW2, and a first capacitor C1. A first terminal of the first transistor NM1 is coupled to a third node N3 of the second circuit 620, a control terminal of the first transistor NM1 is coupled to a first connection node between the first switch SW1 and a first terminal of the first capacitor C1, wherein a second terminal of the first capacitor C1 is coupled to the second reference voltage level (e.g., ground). The first switch SW1 is coupled between the first connection node CN1 and the connection node between the first clamping circuit 640 and the second clamping circuit 650, wherein the first switch SW1 is switched on to electrically couple the connection node to the first transistor NM1 and the first capacitor C1, and the first switch SW1 is switched off to electrically isolate the connection node from the first transistor NM1 and the first capacitor C1, The second switch SW2 is coupled between a second terminal of the first transistor NM1 and the further connection node between the first clamping circuit 640 and the second clamping circuit 650, wherein the second switch SW2 is switched on to electrically couple the further connection node to the first transistor NM1, and the second switch SW2 is switched off to electrically isolate the further connection node from the first transistor. The first capacitor C1 is configured to store electric charge corresponding to a voltage to the control terminal of the first transistor NM1.

The second clamping circuit 650 includes a second transistor NM2, a third switch SW3, a fourth switch SW4, and a second capacitor C2. A first terminal of the second transistor NM2 is coupled to a fourth node N4 of the third circuit 630, a control terminal of the second transistor NM2 is coupled to a second connection node CN2 between the third switch SW3 and a first terminal of the second capacitor C2, and a second terminal of the second capacitor C2 is coupled to the second reference voltage level (e.g., ground). The third switch SW3 is coupled between the second connection node CN2 and the connection node between the first clamping circuit 640 and the second clamping circuit 650, wherein the third switch SW3 is switched on to electrically couple the connection node to the second transistor NM2 and the second capacitor C2, and the third switch SW3 is switched off to electrically isolate the connection node from the second transistor NM2 and the second capacitor C2.

The fourth switch SW4 is coupled between a second terminal of the second transistor NM2 and the further connection node between the first clamping circuit 640 and the second clamping circuit 650, wherein the fourth switch SW4 is switched on to electrically couple the further connection node to the second transistor NM2, and the fourth switch SW4 is switched off to electrically isolate the further connection node from the second transistor NM2. The second capacitor C2 is configured to store electric charge corresponding to a voltage to the control terminal of the second transistor NM2. The operations for the voltage comparator of FIG. 8A in the embodiment of the present disclosure are described in the steps S810 to S840 in FIG. 8B.

The operations for the voltage comparator of FIGS. 7A and 7B in the embodiment of the present disclosure are described as follows. Take FIG. 7A as example, the second circuit 620 in FIG. 7A includes a main branch circuit with transistors M4 and MT1 and a plurality of first trimming branch circuits. Each first trimming branch circuit has a current path via each first trimming transistor TT11 to TT1M and a first trimming switch TS11 to TS1M. Each first trimming switch TS11 to TS1M is for conducting the current path or not and is controlled by the controller 140 in FIG. 5. The controller 140 in FIG. 5 controls a number of the switches in the trimming branch circuits, and sense the voltage VBL corresponding to the bit line BL and the VRBL corresponding to the reference bit line RBL are the same or not, so as to trim the voltage VBL and the VRBL to be the same voltage level. The controller 140 in FIG. 5 may use the step-by-step fine adjustment scenario or the binary approximation fine adjustment scenario to determine the number of the first trimming switches TS11 to TS1M are turned off and the other first trimming switches TS11 to TS1M are turned on and sense the voltage $V_{BL}$ corresponding to the bit line BL and the VRBL corresponding to the reference bit line RBL are the same or not. And, the third circuit 630 in FIG. 7B includes a main branch circuit with transistors M5 and MT2 and a plurality of second trimming branch circuits. Each second trimming branch circuit has a current path via each second trimming transistor TT21 to TT2M and a second trimming switch TS21 to TS2M. Each second trimming switch TS21 to TS2M is for conducting the current path or not and is controlled by the controller 140 in FIG. 5. The operation of the third circuit 630 in FIG. 7B may the same as the second circuit 620 in FIG. 7A.

Figure 8B:
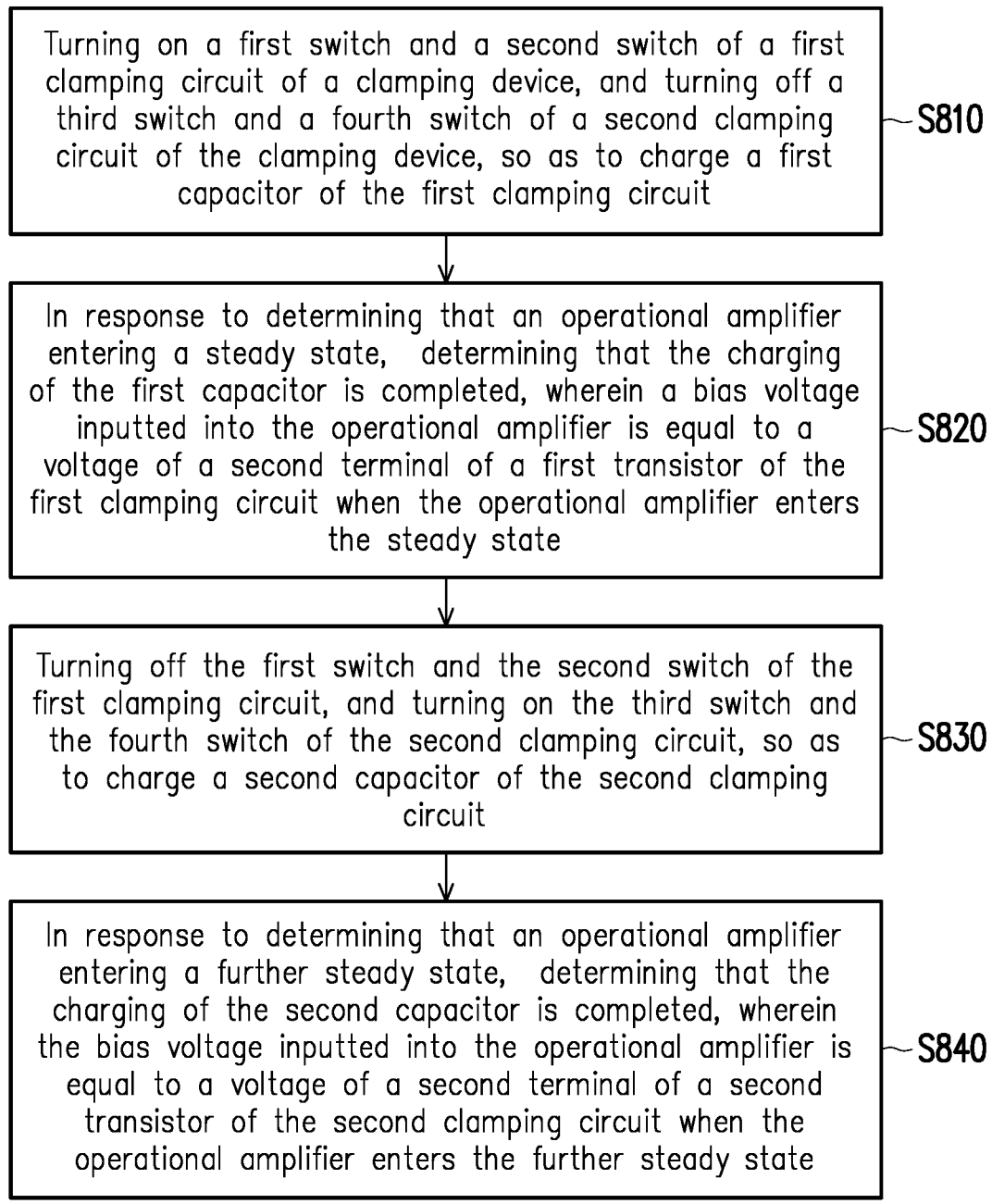
FIG. 8B illustrates a flowchart diagram of charging clamping voltages by the offset-compensation clamping device in FIG. 8A, in accordance with some embodiments of the present disclosure.

FIG. 8B illustrates a flowchart diagram of charging clamping voltages by the offset-compensation clamping device in FIG. 8A, in accordance with some embodiments of the present disclosure. Steps of the flowchart diagram of FIG. 8B may be implemented by the controller 140 in FIG. 5 while the offset compensation function of the clamping device 525 for charging clamping voltages according to VBL and VRBL in FIG. 8A is performed. The controller 140 in FIG. 5 may be implemented by the processor, the integrated circuit, the micro-controller (MCU), or other types of controlling circuit module. Referring to FIG. 8A and FIG. 8B, in step S810, turning on, by the control signal SE1 (e.g., at high level), a first switch SW1 and a second switch SW2 of a first clamping circuit 640 of a clamping device 525, and turning off, by the control signal SE2 (e.g., at low level), a third switch SW3 and a fourth switch SW4 of a second clamping circuit 650 of the clamping device 525, so as to charge a first capacitor C1 of the first clamping circuit 640. The first capacitor C1 would be charged to a first clamping voltage Vclamp1 when the operational amplifier OP entering the steady state. That is, while the voltage on the bit line BL is larger than the bias voltage VBL, the operational amplifier OP enters the steady state.

In step S820, in response to determining that an operational amplifier OP entering the steady state, determining that the charging of the first capacitor C1 is completed, wherein a bias voltage $V_{bias}$ inputted into the operational amplifier OP is equal to a voltage (e.g., $V_{BL}$) of a second terminal of a first transistor NM1 of the first clamping circuit 640 when the operational amplifier OP enters the steady state. In other words, in response to the operational amplifier OP entering the steady state after turning on both the first switch SW1 and the second switch SW2 and turning off both the third switch SW3 and the fourth switch SW4, the obtained voltage from the first resistor $R_{BL}$ of FIG. 6 at a third node CN3 is equal to the bias voltage $V_{bias}$, and the electric charge corresponding to the voltage (e.g., $V_{clamp1}$) to the control terminal of the first transistor NM1 is stored in the first capacitor C1.

In step S830, turning off, by the control signal SE1 (e.g., at low level), the first switch SW1 and the second switch SW2 of the first clamping circuit 640, and turning on, by the control signal SE2 (e.g., at high level), the third switch SW3 and the fourth switch SW4 of the second clamping circuit 650, so as to charge a second capacitor C2 of the second clamping circuit 650. The capacitor C2 would be charged to a second clamping voltage $V_{clamp2}$ when the operational amplifier OP entering the further steady state. That is, while the voltage on the reference bit line RBL is larger than the bias voltage $V_{BL}$, the operational amplifier OP enters the further steady state.

In step S840, in response to determining that an operational amplifier OP entering a further steady state, determining that the charging of the second capacitor is completed, wherein the bias voltage $V_{bias}$ inputted into the operational amplifier OP is equal to a voltage (e.g., $V_{RBL}$) of a second terminal of a second transistor NM2 of the second clamping circuit 650 when the operational amplifier OP enters the further steady state. In other words, in response to the operational amplifier OP entering a further steady state after turning off both the first switch SW1 and the second switch SW2 and turning on both the third switch SW3 and the fourth switch SW4, the obtained voltage from the second resistor $R_{RBL}$ of FIG. 6 at a fourth node CN4 is equal to the bias voltage $V_{bias}$, and the electric charge corresponding to the voltage (e.g., $V_{clamp2}$) to the control terminal of the second transistor NM2 is stored in the second capacitor C2.

In other words, after steps S810-S840, the first clamping voltage $V_{clamp1}$ and the second clamping voltage $V_{clamp2}$ is obtained by the capacitors C1 and C2, and the voltages corresponding to the second terminals (i.e., the third node CN3 and the fourth node CN4) of the n-type transistors NM1 and NM2 would be the same (e.g., $V_{bias}$) while the first clamping voltage $V_{clamp1}$ and the second clamping voltage $V_{clamp2}$ are provided to the control terminals of the n-type transistors NM1 and NM2, so as to eliminate the effect by the mismatch between the n-type transistors NM1 and NM2 due to unavoidable process variations.

It should be noted that the value of the bias voltage Vbias is predetermined according to the type of the memory cells. For example, for the MRAM (Magnetoresistive Random Access Memory), the bias voltage Vbias may be set around 200 mV; for the RRAM (Resistive random-access memory), the bias voltage Vbias may be set around 300 mV. If the value of the bias voltage Vbias is set to a value (e.g., 400 mV for MRAM or 600 mV for RRAM) much higher than a suitable level, the possibility of occurring the read disturb phenomenon would be increased much.

Figure 8C:
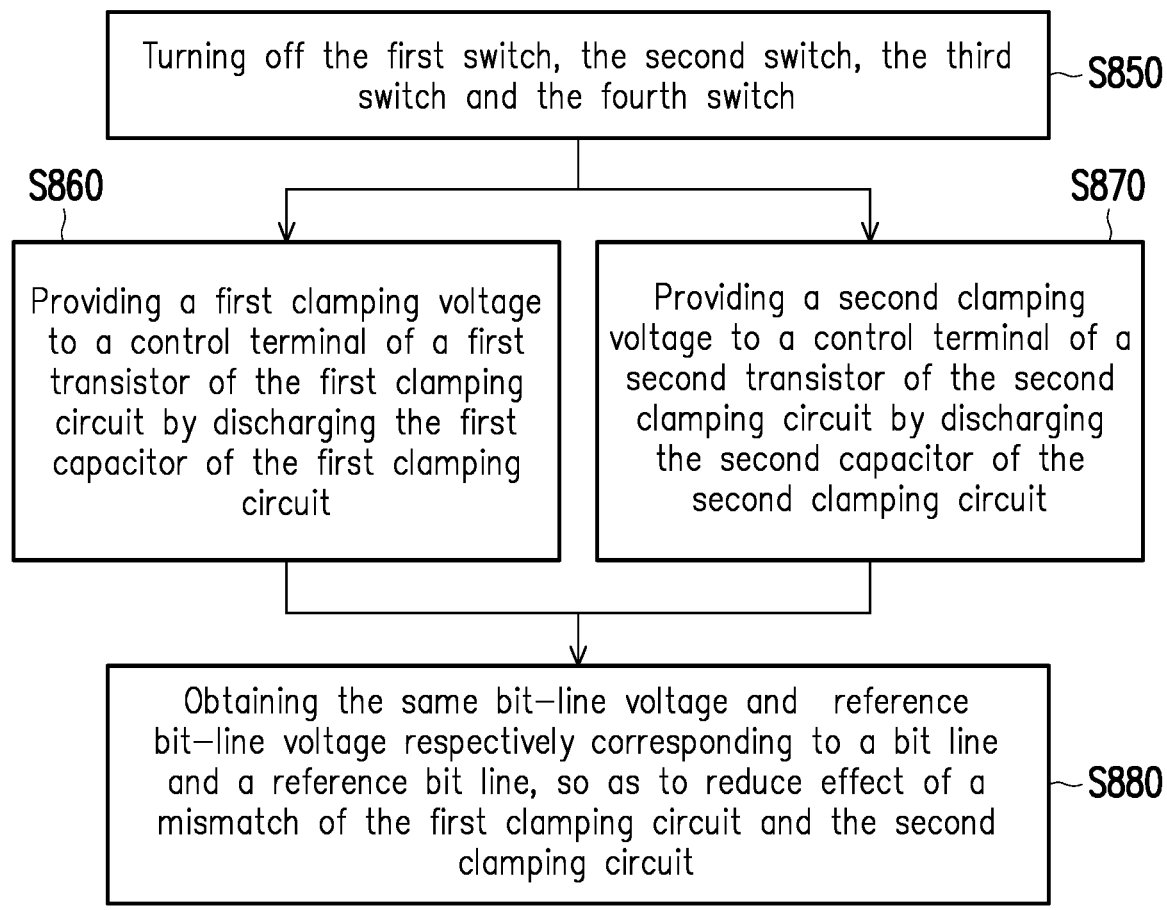
FIG. 8C illustrates a flowchart diagram of discharging clamping voltages by the offset-compensation clamping device in FIG. 8A, in accordance with some embodiments of the present disclosure.

FIG. 8C illustrates a flowchart diagram of discharging clamping voltages by the offset-compensation clamping device in FIG. 8A, in accordance with some embodiments of the present disclosure. Steps of the flowchart diagram of FIG. 8C may be implemented by the controller 140 in FIG. 5 while the offset compensation function of the clamping device 525 for discharging clamping voltages according to $V_{BL}$ and $V_{RBL}$ in FIG. 8A is performed. Referring to FIG. 8A and FIG. 8C, in step S850, turning off, by the control signals SE1 and SE2, the first switch, the second switch, the third switch and the fourth switch.

Next, in step S860, providing, by the first capacitor C1, a first clamping voltage $V_{clamp1}$ to a control terminal of a first transistor NM1 of the first clamping circuit 640 by discharging the first capacitor C1 of the first clamping circuit 640; and in step S870, providing a second clamping voltage $V_{clamp2}$ to a control terminal of a second transistor NM2 of the second clamping circuit 650 by discharging the second capacitor C2 of the second clamping circuit 650.

Next, in step S880, obtaining the same bit-line voltage $V_{BL}$ and reference bit-line voltage $V_{RBL}$ respectively corresponding to a bit line BL and a reference bit line RBL, so as to reduce effect of a mismatch of the first clamping circuit 640 (e.g., the first transistor NM1) and the second clamping circuit 650 (e.g., the second transistor NM2). Specifically, since the first clamping voltage $V_{clamp1}$ and the second clamping voltage $V_{clamp2}$ are received by the control terminals of the first transistor NM1 and the second transistors NM2, the first transistor NM1 and the second transistors NM2 are held on and the voltages (e.g., $V_{BL}$ and $V_{RBL}$) at the second terminal of the first transistor NM1 and the second transistor NM2 would be the same (e.g., the same as the bias voltage $V_{bias}$).

Figure 9:
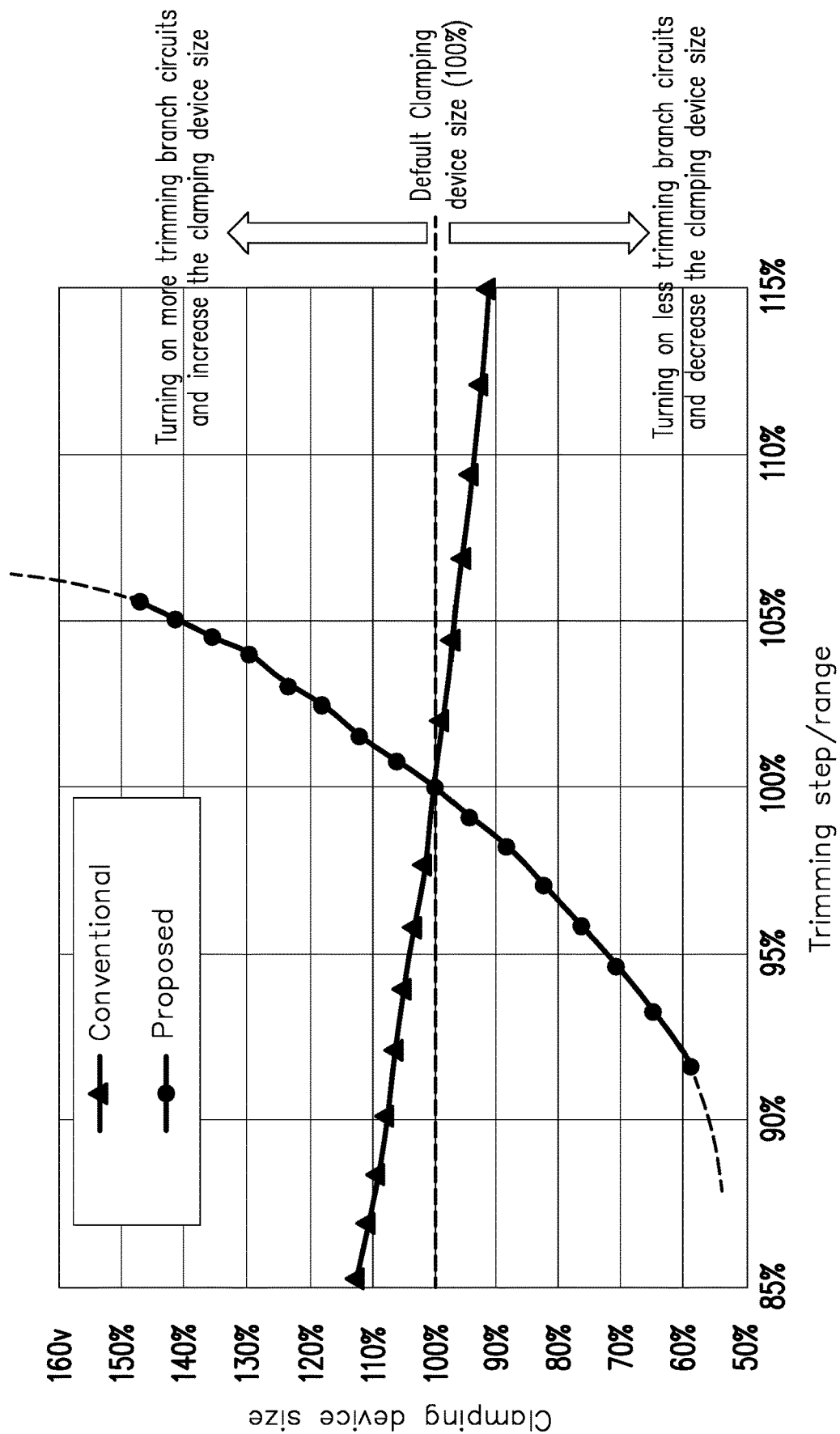
FIG. 9 illustrates a schematic diagram of adjusting clamping device size by trimming branches, in accordance with some embodiments of the present disclosure.

FIG. 9 illustrates a schematic diagram of adjusting clamping device size by trimming branches, in accordance with some embodiments of the present disclosure. Referring to FIG. 9 and FIG. 4A (or FIG. 4B), the proposed curve represents the relationship between the trimming step/range and the clamping device size of the provided trimmable clamping device. The middle clamping size "100%" is the default size of the clamping device (e.g., the first/second clamping circuit) which is corresponding to the "100%" trimming step (e.g., 8 trimming branch circuits are turned on). The clamping device size represents the total amount of the ratios of the width and the length of the transistors of the first/second clamping circuit. The device sizes of all of the transistors of the trimming branch circuits are predetermined and different.

Furthermore, as indicated by the arrows in FIG. 9, turning on more trimming branches would increase the clamping device size, and turning on less trimming branch circuits would decrease the clamping device size. Each trimming step may affect 1.3% of the default bit-line voltage or default reference bit-line voltage.

For example, if the reference bit-line voltage VRBL of the second clamping circuit 223 is needed to be decreased to compensate the mismatch for the first clamping circuit 222, the amount of the turned-on second trimming switches is adjusted from 8 (the amount of the default turned-on second trimming switches) to 7 (e.g., the second trimming switches TS11-TS17 are currently turned-on after turning off the second trimming switch TS18), and the reference bit-line voltage VRBL is decreased to 98.7% of the original 100% of the reference bit-line voltage VRBL. In the meantime, the clamping device size of the second clamping circuit is decreased to around 92% of the original clamping device size (100%). In the embodiment of the present disclosure, the formula of the proposed curve is:

$$y=55.258x3-140.46x2+121.81x-35.609$$

y represents the clamping device size and x represent the expected percentage comparing to original 100% voltage (e.g., VBL or VRBL) corresponding to the bit line of the reference bit line. For example, assuming that x is equal to 1.013 (total amount of the turned-on trimming branch circuits is adjusted to 9 from 8), the expected trimmed voltage is 101.3% (100%+1.3%) of the 100% voltage. According to the above formula, the clamping device size (y) would be adjusted as 109% of the original 100% clamping device size.

It should be noted that, in the embodiment of the present disclosure, the interval of each of the trimming steps is 1.3% of the original voltage, but the invention is not limited thereto. For example, in another embodiment, the interval of each of the trimming steps may be set as other value according to the formula of the proposed curve. Furthermore, the total amount of the trimming branch circuits of one trimmable clamping circuit would be increased to a value larger than 16 (e.g., as illustrated by the dot line).

Referring back to FIG. 6, the sense amplifier 520 further includes a first resistor $R_{BL}$ and a second resistor $R_{RBL}$. The first resistor $R_{BL}$ is coupled between the bit line BL and a third connection node CN3 between the second switch SW2 and the second terminal of the first transistor NM1. The second resistor $R_{RBL}$ is coupled between the reference bit line RBL and a fourth connection node CN4 between the fourth switch SW4 and the second terminal of the second transistor NM2. Furthermore, a voltage (e.g., $V_{BL}$) to the first resistor $R_{BL}$ corresponding to the bit line BL is obtained after turning on both the first switch SW1 and the second switch SW2 and turning off both the third switch SW3 and the fourth switch SW4; and a voltage (e.g., $V_{RBL}$) to the second resistor $R_{RBL}$ corresponding to the reference bit line RBL is obtained after turning on both the third switch SW3 and the fourth switch SW4 and turning off both the first switch SW1 and the second switch SW2. Moreover, when the switches SW1-SW4 are turned off, the voltage $V_{BL}$ and voltage $V_{RBL}$ which are equal to bias voltage $V_{bias}$ are obtained.

Figure 10:
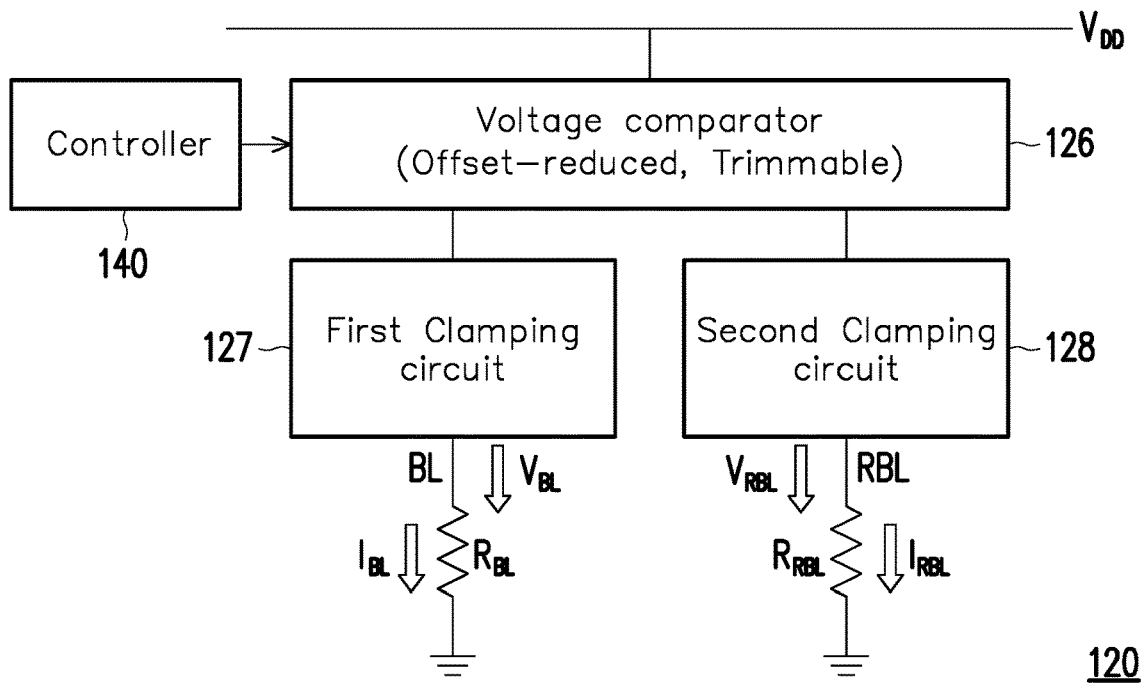
FIG. 10 illustrates a schematic block diagram of a sense amplifier having an offset-compensation and trimmable voltage comparator, in accordance with some embodiments of the present disclosure.

Referring to FIG. 10, in an embodiment of the present disclosure, the sense amplifier 120 includes an offset-compensation and trimmable voltage comparator 126 (e.g., the voltage comparator has a offset-compensation function and a trimming correction function), a first clamping circuit 127 and a second clamping circuit 128. The first clamping circuit 127 and the second clamping circuit 128 may be the clamping circuits with main branch circuit in FIG. 3A for example, and the first clamping circuit 127 and the second clamping circuit 128 do not have the plurality of the trimming branch circuits in FIG. 3A. The sense amplifier 120 further includes a controller 140. The controller 140 may couple to the offset-compensation and trimmable voltage comparator 126 for controlling switches into the offset-compensation and trimmable voltage comparator 126, so as to implement the functions of the offset-compensation and trimmable voltage comparator 126.

Figure 11:
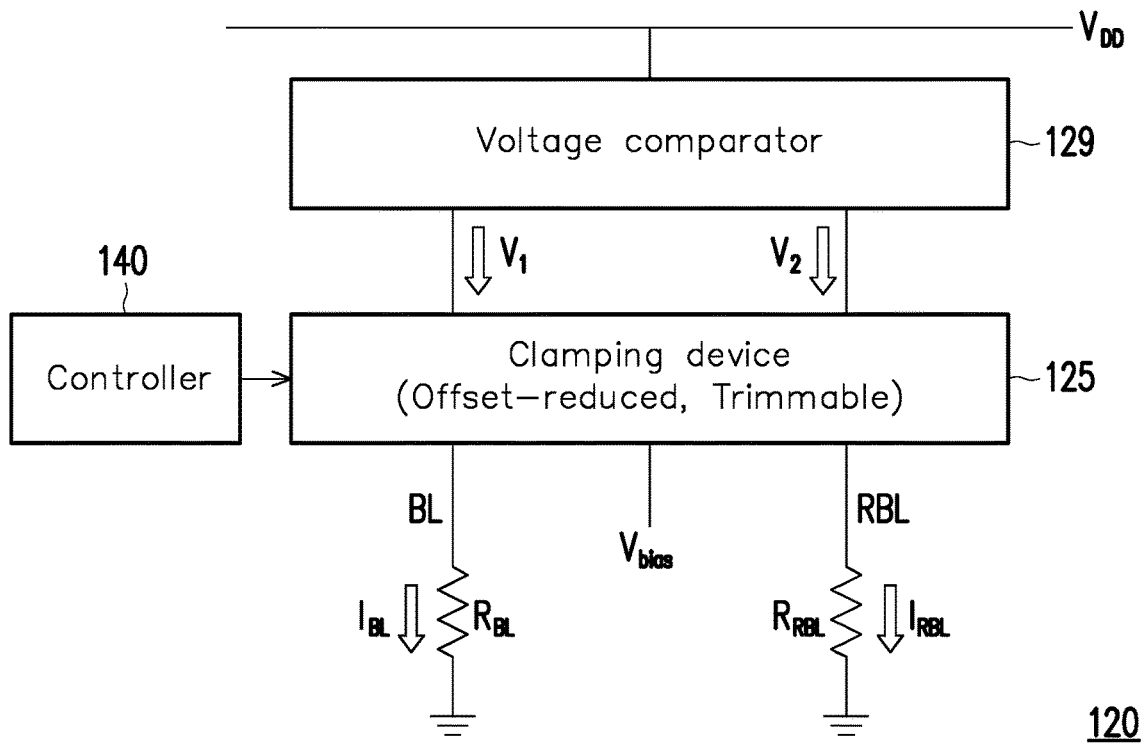
FIG. 11 illustrates a schematic block diagram of a sense amplifier having an offset-compensation and trimmable clamping device, in accordance with some embodiments of the present disclosure.

Referring to FIG. 11, in an embodiment of the present disclosure, the sense amplifier 120 includes a conventional voltage comparator 129, and a offset-compensation and trimmable clamping device 130 (e.g., the clamping device has an offset-compensation function and a trimming correction function). The sense amplifier 120 further includes a controller 140. The controller 140 may couple to the offset-compensation and trimmable clamping device 130 for controlling switches into offset-compensation and trimmable clamping device 130, so as to implement the functions of the offset-compensation and trimmable clamping device 130.

Based on the foregoing embodiments, the provided sense amplifier having the offset-compensation function and trimming correction function and the non-volatile memory using the same are capable of reducing the needed adjusting offset for compensating the mismatch of the transistors corresponding to the bit line and the reference bit line, and trimming the voltages corresponding to the bit line and the reference bit line for compensating the mismatch of the transistors corresponding to the bit line and the reference bit line. Furthermore, the total amount of the trimming steps/range corresponding to the trimmable voltage comparator may be decreased because of the provided offset-compensation clamping device. Therefore, the efficiency and the accuracy of sensing operation (read operation) performed on the memory cell would be improved by the provided sense amplifier.

In some embodiments of the present disclosure, a sense amplifier is provided. The sense amplifier includes a voltage comparator with offset compensation, a first clamping circuit, and a second clamping circuit. The voltage comparator with offset compensation is coupled to a bit line and a reference bit line via a first I/O node and a second I/O node of the sense amplifier respectively, and is configured to compare a first input voltage and a second input voltage to output a sensing signal. The first clamping circuit is coupled between the first I/O node and the bit line. The second clamping circuit is coupled between the second I/O node and the reference bit line. The first clamping circuit and the second clamping circuit trim a voltage corresponding to the bit line and a voltage corresponding to the reference bit line respectively to match the voltage corresponding to the reference bit line with the voltage corresponding to the bit line.

In some embodiments of the present disclosure, a sense amplifier is provided. The further sense amplifier includes a voltage comparator and a clamping circuit. The voltage comparator is coupled to a bit line and a reference bit line, and is configured to compare a first input voltage and a second input voltage to output a sensing signal. The clamping circuit is coupled between the voltage comparator, the bit line and the reference bit line. One of the voltage comparator and the clamping circuit is with offset compensation. The voltage comparator is further configured to trim a first voltage corresponding to the bit line and a second voltage corresponding to the reference bit line to match the voltage corresponding to the reference bit line with the voltage corresponding to the bit line In some embodiments of the present disclosure, an operating method for a non-volatile memory is provided. The non-volatile memory comprises a memory array and a sense amplifier, wherein the sense amplifier comprises a voltage comparator with offset compensation, a first clamping circuit, and a second clamping circuit, the first clamping circuit is coupled between a first I/O node of the sense amplifier and a bit line, and the second clamping circuit is coupled between a second I/O node of the sense amplifier and a reference bit line. The operating method comprises following steps: comparing, by the voltage comparator, a first input voltage and a second input voltage via the first I/O node and the second I/O node of the sense amplifier respectively to output a sensing signal; and, trimming, by the first clamping circuit and the second clamping circuit, a voltage corresponding to the bit line and a voltage corresponding to the reference bit line respectively to match the voltage corresponding to the reference bit line with the voltage corresponding to the bit line.

In some embodiments of the present disclosure, an operating method for a non-volatile memory is provided. The non-volatile memory comprises a memory array and a sense amplifier. The sense amplifier comprises a voltage comparator and a clamping circuit, the clamping circuit is coupled with a first I/O node of the sense amplifier, a bit line, a second I/O node of the sense amplifier, and a reference bit line, and one of the voltage comparator and the clamping circuit is with offset compensation. The operating method comprises following steps: comparing, by the voltage comparator, a first input voltage and a second input voltage via the first I/O node and the second I/O node of the sense amplifier respectively to output a sensing signal; and, trimming, by the voltage comparator, a voltage corresponding to the bit line and a voltage corresponding to the reference bit line respectively to match the voltage corresponding to the reference bit line with the voltage corresponding to the bit line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A sense amplifier, comprising:
a voltage comparator with offset compensation, coupled to a bit line and a reference bit line via a first I/O node and a second I/O node of the sense amplifier respectively, and configured to compare a first input voltage and a second input voltage to output a sensing signal;
a first clamping circuit, coupled between the first I/O node of the sense amplifier and the bit line; and
a second clamping circuit, coupled between the second I/O node of the sense amplifier and the reference bit line,
wherein the first clamping circuit and the second clamping circuit trim a voltage corresponding to the bit line and a voltage corresponding to the reference bit line respectively to match the voltage corresponding to the reference bit line with the voltage corresponding to the bit line.

2. The sense amplifier of claim 1, wherein the first clamping circuit comprises a first main branch circuit and a plurality of first trimming branch circuits,
wherein the first main branch circuit comprises:
a first main transistor, having a first terminal, a second terminal and a control terminal, wherein the first terminal of the first main transistor is coupled to a first connection node between the first I/O node of the sense amplifier and the first clamping circuit, and the control terminal of the first main transistor is coupled to receive a clamping voltage; and
a first main switch, coupled between the second terminal of the first main transistor and the bit line, wherein the first main switch is switched on to electrically couple the bit line to the first main transistor, and the first main switch is switched off to electrically isolate the bit line from the first main transistor, and
each of the first trimming branch circuits comprises:
a first trimming transistor, having a first terminal, a second terminal and a control terminal, wherein the first terminal of the first trimming transistor is coupled to the first connection node, and the control terminal of the first trimming transistor is coupled to receive the clamping voltage; and a first trimming switch, coupled between the second terminal of the first trimming transistor and a second connection node between the first main switch and the bit line, wherein the first trimming switch is switched on to electrically couple the bit line to the first trimming transistor, and the first trimming switch is switched off to electrically isolate the bit line from the first trimming transistor.

3. The sense amplifier of claim 2, wherein the second clamping circuit comprises a second main branch circuit and a plurality of second trimming branch circuits,
wherein the second main branch circuit comprises:
a second main transistor, having a first terminal, a second terminal and a control terminal, wherein the first terminal of the second main transistor is coupled to a first connection node between the second I/O node of the sense amplifier and the second clamping circuit, and the control terminal of the second main transistor is coupled to receive a clamping voltage; and
a second main switch, coupled between the second terminal of the second main transistor and the reference bit line, wherein the second main switch is switched on to electrically couple the reference bit line to the second main transistor, and the second main switch is switched off to electrically isolate the reference bit line from the second main transistor, and,
each of the second trimming branch circuits comprises:
a second trimming transistor, having a first terminal, a second terminal and a control terminal, wherein the first terminal of the second trimming transistor is coupled to the first connection node, and the control terminal of the second trimming transistor is coupled to receive the clamping voltage; and
a second trimming switch, coupled between the second terminal of the second trimming transistor and a second connection node between the second main switch and the reference bit line, wherein the second trimming switch is switched on to electrically couple the reference bit line to the second trimming transistor, and the second trimming switch is switched off to electrically isolate the reference bit line from the second trimming transistor.

4. The sense amplifier of claim 3, wherein the voltage corresponding to the bit line is trimmed by turning-on or turning-off one or more of the first trimming switches, and the trimmed voltage corresponding to the bit line is proportional to the total number of currently turned-on first trimming switches of the first clamping circuit, and,
the voltage corresponding to the reference bit line is trimmed by turning-on or turning-off one or more of the second trimming switches, and the trimmed voltage corresponding to the reference bit line is proportional to the total number of currently turned-on second trimming switches of the second clamping circuit.

5. The sense amplifier of claim 1, the voltage comparator comprises:
a first circuit; and
a second circuit, wherein the first circuit and the second circuit are coupled to the first I/O node and the second I/O node of the sense amplifier,
wherein the first circuit comprises:
a first transistor, a second transistor and a third transistor, wherein
a first terminal of the first transistor and a first terminal of the second transistor are coupled to a first reference voltage level, a control terminal of the first transistor, a control terminal of the second transistor and a control terminal of the third transistor are coupled to receive a pre-charge signal, a second terminal of the first transistor and a second terminal of the third transistor are coupled to a connection node between the first I/O node of the sense amplifier, the first transistor and the third transistor, and a second terminal of the second transistor and a first terminal of the third transistor are coupled to a further connection node between the second I/O node of the sense amplifier, the second transistor and the third transistor.

6. The sense amplifier of claim 5, wherein the second circuit of the voltage comparator comprises:

a fourth transistor, a fifth transistor, a pair of first p-type transistors, a pair of first n-type transistors, a pair of second p-type transistors, and a pair of second n-type transistors, wherein the pair of the first p-type transistors and the pair of the first n-type transistors form a third circuit, the pair of the second p-type transistors and the pair of the second n-type transistors form a fourth circuit, the third circuit is cross-coupled to the fourth circuit, and, outputs of the third circuit and the fourth circuit are coupled to the first I/O node and the second I/O node of the sense amplifier, wherein the fourth transistor is coupled to the third circuit and the fourth circuit, wherein a first terminal of the fourth transistor is coupled to the first reference voltage level, a second terminal of the fourth transistor is coupled to a connection node between the fourth transistor, the third circuit, and the fourth circuit, and, a control terminal of the fourth transistor is coupled to receive a first enable signal, wherein the fifth transistor is coupled to the third circuit and the fourth circuit, wherein a first terminal of the fifth transistor is coupled to a connection node between the fifth transistor, the third circuit, and the fourth circuit, a second terminal of the fifth transistor is coupled to a second reference voltage level, and a control terminal of the fifth transistor is coupled to receive a second enable signal.

7. The sense amplifier of claim 1, wherein the difference between a first output voltage and a second output voltage corresponding to the sensing signal is larger than the difference between the first input voltage and the second input voltage, wherein the first input voltage is inputted to the voltage comparator via the first I/O node of the sense amplifier, the second input voltage is inputted to the voltage comparator via the second I/O node of the sense amplifier, the first output voltage is outputted from the voltage comparator via the first I/O node of the sense amplifier, and the second output voltage is outputted from the voltage comparator via the second I/O node of the sense amplifier, and the sense amplifier further comprising:

a first resistor, coupled between the first clamping circuit and the bit line; and a second resistor, coupled between the second clamping circuit and the reference bit line.

8. A sense amplifier, comprising:

a voltage comparator, coupled to a bit line and a reference bit line, and configured to compare a first input voltage and a second input voltage to output a sensing signal; and a clamping circuit, coupled between the voltage comparator, the bit line and the reference bit line, wherein one of the voltage comparator and the clamping circuit is with offset compensation, wherein the voltage comparator is further configured to trim a first voltage corresponding to the bit line and a second voltage corresponding to the reference bit line to match the voltage corresponding to the reference bit line with the voltage corresponding to the bit line.

9. The sense amplifier of claim 8, wherein the voltage comparator comprises:

a first circuit;

a second circuit; and a third circuit, wherein the second circuit is cross-coupled to the third circuit via a first I/O node and a second I/O node of the sense amplifier, wherein the first circuit comprises:

a first transistor, a second transistor and a third transistor, wherein a first terminal of the first transistor and a first terminal of the second transistor are coupled to a first reference voltage level, a control terminal of the first transistor, a control terminal of the second transistor and a control terminal of the third transistor are coupled to receive a pre-charge signal, a second terminal of the first transistor and a second terminal of the third transistor are coupled to a connection node between a first node, the first transistor and the third transistor, and, a second terminal of the second transistor and a first terminal of the third transistor are coupled to a further connection node between a second node, the second transistor and the third transistor.

10. The sense amplifier of claim 9, wherein the second circuit comprises:

a fourth transistor;

a first main branch circuit; and a plurality of first trimming branch circuits, wherein a first terminal of the fourth transistor is coupled to the first reference voltage level, a control terminal of the fourth transistor is coupled to the first node, and a second terminal of the fourth transistor is coupled to the first main branch circuit via the first I/O node of the sense amplifier, wherein the first trimming branch circuits are coupled to the first main branch circuit via a third node.

11. The sense amplifier of claim 10, wherein the first main branch circuit comprises:

a first main transistor, wherein a first terminal of the first main transistor is coupled to the first I/O node of the sense amplifier, a control terminal of the first main transistor is coupled to a first connection node between the first node and the second I/O node of the sense amplifier, and a second terminal of the first main transistor is coupled to the third node, and, each of the first trimming branch circuits comprises:

a first trimming switch; and a first trimming transistor, wherein a first terminal of the first trimming transistor is coupled to the first trimming switch, a control terminal of the first trimming transistor is coupled to the first connection node, and a second terminal of the first trimming transistor is coupled to the third node, wherein the first trimming switch is coupled between the first terminal of the first trimming transistor and the first reference voltage level, wherein the first trimming switch is switched on to electrically couple the first reference voltage level to the first trimming transistor, and the first trimming switch is switched off to electrically isolate the first reference voltage level from the first trimming transistor, wherein the voltage corresponding to the third node is trimmed by turning-on or turning-off one or more of the first trimming switches, and the trimmed voltage corresponding to the third node is proportional to the total number of currently turned-on first trimming switches of the third circuit.

12. The sense amplifier of claim 9, wherein the third circuit comprises:
a fifth transistor;
a second main branch circuit; and
a plurality of second trimming branch circuits,
wherein a first terminal of the fifth transistor is coupled to the first reference voltage level,
a control terminal of the fifth transistor is coupled to the second node, and
a second terminal of the fifth transistor is coupled to the second main branch circuit via the second I/O node of the sense amplifier,
wherein the second trimming branch circuits are coupled to the second main branch circuit via a fourth node.

13. The sense amplifier of claim 12, wherein the second main branch circuit comprises:
a second main transistor, wherein a first terminal of the second main transistor is coupled to the second I/O node of the sense amplifier, a control terminal of the second main transistor is coupled to a second connection node between the second node and the first I/O node of the sense amplifier, and a second terminal of the second main transistor is coupled to the fourth node, and,
each of the second trimming branch circuits comprises:
a second trimming switch; and
a second trimming transistor, wherein a first terminal of the second trimming transistor is coupled to the second trimming switch, a control terminal of the second trimming transistor is coupled to the second connection node, and a second terminal of the second trimming transistor is coupled to the fourth node, wherein the second trimming switch is coupled between the first terminal of the second trimming transistor and the first reference voltage level, wherein the second trimming switch is switched on to electrically couple the first reference voltage level to the second trimming transistor, and the second trimming switch is switched off to electrically isolate the first reference voltage level from the second trimming transistor, wherein the voltage corresponding to the fourth node is trimmed by turning-on or turning-off one or more of the second trimming switches, and the trimmed voltage corresponding to the fourth node is proportional to the total number of currently turned-on second trimming switches of the third circuit.

14. The sense amplifier of claim 9, wherein the clamping circuit comprises:
a first clamping circuit, coupled between the voltage comparator and the bit line;
a second clamping circuit, coupled between the voltage comparator and the reference bit line; and
an operational amplifier, having an output terminal, a first input terminal, and a second input terminal, wherein the output terminal is coupled to a connection node between the first clamping circuit and the second clamping circuit, the first input terminal is coupled to receive a bias voltage, and the second input terminal is coupled to a further connection node between the first clamping circuit and the second clamping circuit.

15. The sense amplifier of claim 14, wherein the first clamping circuit comprises a first transistor, a first switch, a second switch, and a first capacitor,
Wherein a first terminal of the first transistor is coupled to a third node of the second circuit, a control terminal of the first transistor is coupled to a first connection node between the first switch and a first terminal of the first capacitor,
a second terminal of the first capacitor is coupled to the second reference voltage level,
the first switch is coupled between the first connection node and the connection node between the first clamping circuit and the second clamping circuit, wherein the first switch is switched on to electrically couple the connection node to the first transistor and the first capacitor, and the first switch is switched off to electrically isolate the connection node from the first transistor and the first capacitor,
the second switch is coupled between a second terminal of the first transistor and the further connection node between the first clamping circuit and the second clamping circuit, wherein the second switch is switched on to electrically couple the further connection node to the first transistor, and the second switch is switched off to electrically isolate the further connection node from the first transistor, and
the first capacitor is configured to store electric charge corresponding to a voltage to the control terminal of the first transistor.

16. The sense amplifier of claim 15, wherein the second clamping circuit comprises a second transistor, a third switch, a fourth switch, and a second capacitor,
wherein a first terminal of the second transistor is coupled to a fourth node of the third circuit, a control terminal of the second transistor is coupled to a second connection node between the third switch and a first terminal of the second capacitor,
a second terminal of the second capacitor is coupled to the second reference voltage level,
the third switch is coupled between the second connection node and the connection node between the first clamping circuit and the second clamping circuit, wherein the third switch is switched on to electrically couple the connection node to the second transistor and the second capacitor, and the third switch is switched off to electrically isolate the connection node from the second transistor and the second capacitor,
the fourth switch is coupled between a second terminal of the second transistor and the further connection node between the first clamping circuit and the second clamping circuit, wherein the fourth switch is switched on to electrically couple the further connection node to the second transistor, and the fourth switch is switched off to electrically isolate the further connection node from the second transistor, and the second capacitor is configured to store electric charge corresponding to a voltage to the control terminal of the second transistor.

17. The sense amplifier of claim 16, further comprising:
a first resistor, coupled between the bit line and a third connection node between the second switch and the second terminal of the first transistor; and
a second resistor, coupled between the reference bit line and a fourth connection node between the fourth switch and the second terminal of the second transistor,
wherein a voltage to the first resistor corresponding to the bit line is obtained after turning on both the first switch and the second switch and turning off both the third switch and the fourth switch, and
a voltage to the second resistor corresponding to the reference bit line is obtained after turning on both the third switch and the fourth switch and turning off both the first switch and the second switch.

18. The sense amplifier of claim 17, wherein
in response to the operational amplifier entering a steady state after turning on both the first switch and the second switch and turning off both the third switch and the fourth switch, the obtained voltage to the first resistor is equal to the bias voltage, and the electric charge corresponding to the voltage to the control terminal of the first transistor is stored in the first capacitor,
in response to the operational amplifier entering a further steady state after turning off both the first switch and the second switch and turning on both the third switch and the fourth switch, the obtained voltage to the second resistor is equal to the bias voltage, and the electric charge corresponding to the voltage to the control terminal of the second transistor is stored in the second capacitor, and,
after turning off the first switch, the second switch, the third switch and the fourth switch together, the first capacitor discharges the stored electric charge to the control terminal of the first transistor to provide the first clamping voltage to the control terminal of the first transistor, and the second capacitor discharges the stored electric charge to the control terminal of the second transistor to provide the second clamping voltage to the control terminal of the second transistor, such that the voltage to the first resistor and the voltage to the second resistor are as the same as the bias voltage.

19. An operating method for a non-volatile memory, the non-volatile memory comprises a memory array and a sense amplifier, wherein the sense amplifier comprises a voltage comparator with offset compensation, a first clamping circuit, and a second clamping circuit, the first clamping circuit is coupled between a first I/O node of the sense amplifier and a bit line, and the second clamping circuit is coupled between a second I/O node of the sense amplifier and a reference bit line,
wherein the operating method comprising:
comparing, by the voltage comparator, a first input voltage and a second input voltage via the first I/O node and the second I/O node of the sense amplifier respectively to output a sensing signal; and
trimming, by the first clamping circuit and the second clamping circuit, a voltage corresponding to the bit line and a voltage corresponding to the reference bit line respectively to match the voltage corresponding to the reference bit line with the voltage corresponding to the bit line.

20. An operating method for a non-volatile memory, the non-volatile memory comprises a memory array and a sense amplifier, wherein the sense amplifier comprises a voltage comparator and a clamping circuit, the clamping circuit is coupled with a first I/O node of the sense amplifier, a bit line, a second I/O node of the sense amplifier, and a reference bit line, and one of the voltage comparator and the clamping circuit is with offset compensation,
wherein the operating method comprising:
comparing, by the voltage comparator, a first input voltage and a second input voltage via the first I/O node and the second I/O node of the sense amplifier respectively to output a sensing signal; and
trimming, by the voltage comparator, a voltage corresponding to the bit line and a voltage corresponding to the reference bit line respectively to match the voltage corresponding to the reference bit line with the voltage corresponding to the bit line.

* * * * *